US011287742B2

United States Patent
Nishimaki et al.

(10) Patent No.: US 11,287,742 B2
(45) Date of Patent: Mar. 29, 2022

(54) COMPOSITION FOR FORMING RESIST UNDERLAYER FILM HAVING IMPROVED FLATTENING PROPERTIES

(71) Applicant: NISSAN CHEMICAL CORPORATION, Tokyo (JP)

(72) Inventors: Hirokazu Nishimaki, Toyama (JP); Takafumi Endo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 16/625,957

(22) PCT Filed: Jun. 22, 2018

(86) PCT No.: PCT/JP2018/023849
§ 371 (c)(1),
(2) Date: Dec. 23, 2019

(87) PCT Pub. No.: WO2018/235949
PCT Pub. Date: Dec. 27, 2018

(65) Prior Publication Data
US 2020/0174370 A1  Jun. 4, 2020

(30) Foreign Application Priority Data

Jun. 23, 2017  (JP) .............................. JP2017-123629

(51) Int. Cl.
*G03F 7/16* (2006.01)
*G03F 7/11* (2006.01)
*C08G 61/12* (2006.01)
*C09D 165/00* (2006.01)
*H01L 21/027* (2006.01)

(52) U.S. Cl.
CPC ................ *G03F 7/11* (2013.01); *C08G 61/12* (2013.01); *C09D 165/00* (2013.01); *G03F 7/162* (2013.01); *G03F 7/168* (2013.01); *H01L 21/0271* (2013.01); *C08G 2261/228* (2013.01); *C08G 2261/312* (2013.01); *C08G 2261/314* (2013.01); *C08G 2261/3162* (2013.01)

(58) Field of Classification Search
CPC .......... G03F 7/11; G03F 7/092; G03F 7/162; G03F 7/168; G03F 7/09; C09D 165/00
See application file for complete search history.

(56) References Cited

U.S. PATENT DOCUMENTS

| 2009/0130594 | A1 | 5/2009 | Takei et al. |
| 2016/0068709 | A1* | 3/2016 | Endo .................... C09D 161/12 438/703 |
| 2017/0315445 | A1 | 11/2017 | Hashimoto et al. |

FOREIGN PATENT DOCUMENTS

| CN | 105874386 A | 8/2016 |
| WO | 2006/115044 A1 | 11/2006 |
| WO | 2013/047516 A1 | 4/2013 |
| WO | 2015/098594 A1 | 7/2015 |
| WO | 2016/072316 A1 | 5/2016 |
| WO | 2017/069063 A1 | 4/2017 |

OTHER PUBLICATIONS

Sep. 4, 2018 International Search Report issued in International Patent Application No. PCT/JP2018/023849.
Sep. 4, 2018 Written Opinion of the International Searching Authority issued in International Patent Application No. PCT/JP2018/023849.
Jul. 16, 2020 Office Action issued in Chinese Patent Application No. 201880041969.X.

* cited by examiner

Primary Examiner — Daborah Chacko-Davis
(74) Attorney, Agent, or Firm — Oliff PLC

(57) ABSTRACT

A method for reducing the level difference (iso-dense bias) (reverse bump) of a resist underlayer film formed on a semiconductor substrate having a stepped portion and a non-stepped portion by 5 nm or more, which comprises a step of applying the composition to an upper surface of the semiconductor substrate having a stepped portion and a non-stepped portion. A method for reducing the level difference (iso-dense bias) of a resist underlayer film, comprising the steps of adding a fluorine-containing surfactant to a resist underlayer film-forming composition containing a polymer and a solvent and applying the composition containing the fluorine-containing surfactant to an upper surface of a semiconductor substrate having a stepped portion and a non-stepped portion. The level difference of a resist underlayer film formed on a semiconductor substrate between a stepped portion and a non-stepped portion (i.e., reverse bump) is reduced by 5 nm or more.

11 Claims, No Drawings

COMPOSITION FOR FORMING RESIST UNDERLAYER FILM HAVING IMPROVED FLATTENING PROPERTIES

TECHNICAL FIELD

The present invention relates to a method involving application of a resist underlayer film-forming composition to an upper surface of a semiconductor substrate having a stepped portion and a non-stepped portion to thereby form a resist underlayer film, so that the level difference (iso-dense bias) in the resist underlayer film is reduced between the stepped portion and the non-stepped portion in a lithography process for producing a semiconductor device.

BACKGROUND ART

In recent years, a resist underlayer film used in a lithography process for producing a semiconductor device (in particular, a resist underlayer film used as an underlayer of a silicon hard mask) has been required to have the following properties: thermal resistance, etching resistance, and a reduction in the level difference (iso-dense bias) in the resist underlayer film between a stepped portion and a non-stepped portion of a semiconductor substrate.

An underlayer film-forming composition for lithography containing a polymer having an arylene group has been disclosed (Patent Document 1). A resist underlayer film-forming composition containing a novolac having a long-chain alkyl group has also been disclosed (Patent Document 2). A resist underlayer film-forming composition containing a novolac polymer having a secondary amino group has also been disclosed (Patent Document 3). A resist underlayer film containing a diarylamine novolac resin has also been disclosed (Patent Document 4).

PRIOR ART DOCUMENTS

Patent Documents

Patent Document 1: International Publication WO 2016/072316 pamphlet
Patent Document 2: International Publication WO 2017/069063 pamphlet
Patent Document 3: International Publication WO 2015/098594 pamphlet
Patent Document 4: International Publication WO 2013/047516 pamphlet

SUMMARY OF THE INVENTION

Problems to be Solved by the Invention

In a resist underlayer film formed on a semiconductor substrate having a stepped portion and a non-stepped portion, the maximum thickness of the resist underlayer film as measured from the upper surface of the substrate at the stepped portion is generally smaller than the minimum thickness of the resist underlayer film as measured from the upper surface of the substrate at the non-stepped portion. However, the maximum thickness may be larger than the minimum thickness (hereinafter such a phenomenon may be referred to as "reverse bump") depending on the components (e.g., polymer structure) of the resist underlayer film-forming composition. In such a case, an increase in iso-dense bias particularly in a lithography process for producing a semiconductor device may cause problems (e.g., defocusing) in a subsequent lithography process.

Means for Solving the Problems

The present inventors have conducted extensive studies, and as a result have found that incorporation of a fluorine-containing surfactant into a resist underlayer film-forming composition exhibiting the aforementioned iso-dense bias property (reverse bump) enables a reduction in the level difference (iso-dense bias, reverse bump) in a resist underlayer film formed on a semiconductor substrate between a stepped portion and a non-stepped portion of the substrate, or elimination of the level difference (i.e., nearly zero level difference). The present invention has been accomplished on the basis of this finding.

Accordingly, the present invention provides the following:

[1] A method for reducing the level difference (iso-dense bias) of a resist underlayer film by 5 nm or more, the method being characterized by comprising the steps of:

adding a fluorine-containing surfactant (C) to a resist underlayer film-forming composition containing a polymer (A) and a solvent (D); and applying the composition containing the fluorine-containing surfactant (C) to an upper surface of a semiconductor substrate having a stepped portion and a non-stepped portion, in a resist underlayer film formed by a method containing a step of applying the resist underlayer film-forming composition before addition of the fluorine-containing surfactant (C) to an upper surface of a semiconductor substrate, maximum thickness of the resist underlayer film as measured from the upper surface of the substrate at a stepped portion is larger than minimum thickness of the resist underlayer film as measured from the upper surface of the substrate at a non-stepped portion, wherein a difference of 5 nm or more is established between a thickness difference in the resist underlayer film formed from the resist underlayer film-forming composition containing the fluorine-containing surfactant (C) and a thickness difference in the resist underlayer film formed from the resist underlayer film-forming composition before addition of the fluorine-containing surfactant (C) in which the thickness difference in the resist underlayer film is determined by subtraction of the thickness of the film at the stepped portion from the thickness of the film at the non-stepped portion.

[2] The method according to [1], wherein the resist underlayer film-forming composition further contains a crosslinkable compound (B).

[3] The method according to [1], wherein the polymer (A) includes a partial structure of the following Formula (2):

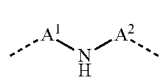

Formula (2)

[wherein $A^1$ is a phenylene group or a naphthylene group; $A^2$ is a phenylene group, a naphthylene group, or an organic group of the following Formula (3):

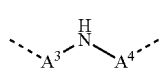

Formula (3)

(wherein $A^3$ and $A^4$ are each independently a phenylene group or a naphthylene group, and a dotted line is a bond); and a dotted line is a bond].

[4] The method according to [1], wherein the polymer (A) includes a unit structure of the following Formula (1):

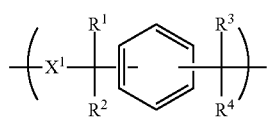

Formula (1)

(wherein $R^1$ to $R^4$ are each independently a hydrogen atom or a methyl group; and $X^1$ is a divalent organic group containing at least one arylene group optionally substituted with an alkyl group, an amino group, or a hydroxyl group).

[5] The method according to [4], wherein $X^1$ in Formula (1) is an organic group of Formula (2).

[6] The method according to [1], wherein the polymer (A) contains a novolac resin prepared by reaction between an aromatic compound (A1) and an aldehyde (B1) having a formyl group bonded to a secondary carbon atom or tertiary carbon atom of a $C_{2-26}$ alkyl group.

[7] The method according to [1], wherein the polymer (A) contains a novolac polymer prepared by reaction between an aromatic compound having a secondary amino group and an aldehyde compound.

[8] The method according to [1], wherein the polymer (A) is a polymer including a unit structure (A2) of the following Formula (4):

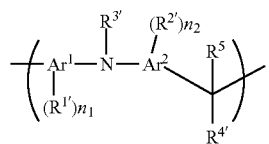

Formula (4)

(wherein $Ar^1$ and $Ar^2$ are each a benzene ring or a naphthalene ring; $R^{1'}$ and $R^{2'}$ are each a substituent for a hydrogen atom on the corresponding ring and is selected from the group consisting of a halogen atom, a nitro group, an amino group, a hydroxy group, a $C_{1-10}$ alkyl group, a $C_{2-10}$ alkenyl group, a $C_{6-40}$ aryl group, and any combination of these, wherein the alkyl group, the alkenyl group, and the aryl group are each an organic group optionally containing an ether bond, a ketone bond, or an ester bond; $R^{3'}$ is selected from the group consisting of a hydrogen atom, a $C_{1-10}$ alkyl group, a $C_{2-10}$ alkenyl group, a $C_{6-40}$ aryl group, and any combination of these, wherein the alkyl group, the alkenyl group, and the aryl group are each an organic group optionally containing an ether bond, a ketone bond, or an ester bond; $R^{4'}$ is selected from the group consisting of a $C_{6-40}$ aryl group and a heterocyclic group, wherein the aryl group and the heterocyclic group are each an organic group optionally substituted with a halogen atom, a nitro group, an amino group, a $C_{1-10}$ alkyl group, a $C_{1-10}$ alkoxy group, a $C_{6-40}$ aryl group, a formyl group, a carboxyl group, or a hydroxyl group; $R^5$ is selected from the group consisting of a hydrogen atom, a $C_{1-10}$ alkyl group, a $C_{6-40}$ aryl group, and a heterocyclic group, wherein the alkyl group, the aryl group, and the heterocyclic group are each an organic group optionally substituted with a halogen atom, a nitro group, an amino group, a hydroxyl group; $R^{4'}$ and $R^5$ optionally form a ring together with the carbon atom to which they are bonded; and $n_1$ and $n_2$ are each an integer of 0 to 3).

[9] The method according to [2], wherein the crosslinkable compound (B) is a crosslinkable compound of the following Formula (11-1) or (12-1):

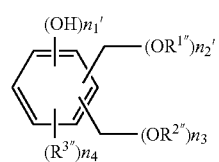

Formula (11-1)

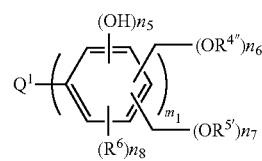

Formula (12-1)

(wherein $Q^1$ is a single bond or an $m_1$-valent organic group; $R^{1'''}$ and $R^{4'''}$ are each a $C_{2-10}$ alkyl group, or a $C_{2-10}$ alkyl group having a $C_{1-10}$ alkoxy group; $R^{2'''}$ and $R^{5'}$ are each a hydrogen atom or a methyl group; $R^{3'''}$ and $R^6$ are each a $C_{1-10}$ alkyl group or a $C_{6-40}$ aryl group; $n_1'$ is an integer satisfying a relation of $1 \leq n_1' \leq 3$, $n_2'$ is an integer satisfying a relation of $2 \leq n_2' \leq 5$, $n_3$ is an integer satisfying a relation of $0 \leq n_3 \leq 3$, $n_4$ is an integer satisfying a relation of $0 \leq n_4 \leq 3$, and a relation of $3 \leq (n_1'+n_2'+n_3+n_4) \leq 6$ is satisfied; and $n_5$ is an integer satisfying a relation of $1 \leq n_5 \leq 3$, $n_6$ is an integer satisfying a relation of $1 \leq n_6 \leq 4$, $n_7$ is an integer satisfying a relation of $0 \leq n_7 \leq 3$, $n_8$ is an integer satisfying a relation of $0 \leq n_8 \leq 3$, and a relation of $2 \leq (n_5+n_6+n_7+n_8) \leq 5$ is satisfied; and $m_1$ is an integer of 2 to 10).

[10] The method according to [1], wherein the level difference (iso-dense bias) is 5 nm to 55 nm.

[11] The method according to [1], wherein the stepped portion of the upper surface of the semiconductor substrate has a step pattern having a width of 50 nm or less.

Effects of the Invention

The present invention provides a method for reducing the level difference (iso-dense bias) of a resist underlayer film by 5 nm or more, the method being characterized by comprising the steps of:

adding a fluorine-containing surfactant (C) to a resist underlayer film-forming composition containing a polymer (A) and a solvent (D); and applying the composition containing the fluorine-containing surfactant (C) to an upper surface of a semiconductor substrate having a stepped portion and a non-stepped portion, in a resist underlayer film formed by a method containing a step of applying the resist underlayer film-forming composition before addition of the fluorine-containing surfactant (C) to an upper surface of a semiconductor substrate, maximum thickness of the resist underlayer film as measured from the upper surface of the substrate at a stepped portion is larger than minimum thickness of the resist underlayer film as measured from the upper surface of the substrate at a non-stepped portion, wherein a difference of 5 nm or more is established between a thickness difference in the resist underlayer film formed from the resist underlayer film-forming composition containing the fluorine-containing surfactant (C) and a thickness difference in the resist underlayer film formed from the resist underlayer film-forming composition before addition of the fluorine-containing surfactant (C) in which the thickness difference in the resist underlayer film is determined by subtraction of the thickness of the film at the stepped portion from the thickness of the film at the non-stepped portion. This method is used as an effective solution for reducing the level difference, when so-called reverse bump occurs in the resist underlayer film formed through application of the resist underlayer film-forming composition to the upper surface of the semiconductor substrate.

MODES FOR CARRYING OUT THE INVENTION

The present invention is directed to a method for reducing the level difference (iso-dense bias) of a resist underlayer film by 5 nm or more, the method being characterized by comprising the steps of:

adding a fluorine-containing surfactant (C) to a resist underlayer film-forming composition containing a polymer (A) and a solvent (D); and applying the composition containing the fluorine-containing surfactant (C) to an upper surface of a semiconductor substrate having a stepped portion and a non-stepped portion, in a resist underlayer film formed by a method containing a step of applying the resist underlayer film-forming composition before addition of the fluorine-containing surfactant (C) to an upper surface of a semiconductor substrate, maximum thickness of the resist underlayer film as measured from the upper surface of the substrate at a stepped portion is larger than minimum thickness of the resist underlayer film as measured from the upper surface of the substrate at a non-stepped portion, wherein a difference of 5 nm or more is established between a thickness difference in the resist underlayer film formed from the resist underlayer film-forming composition containing the fluorine-containing surfactant (C) and a thickness difference in the resist underlayer film formed from the resist underlayer film-forming composition before addition of the fluorine-containing surfactant (C) in which the thickness difference in the resist underlayer film is determined by subtraction of the thickness of the film at the stepped portion from the thickness of the film at the non-stepped portion.

The aforementioned expression "larger than" refers to the case where the maximum thickness is larger than the minimum thickness by, for example, 5 nm or more. For example, the difference between the maximum thickness and the minimum thickness is 5 nm to 100 nm, for example, 5 nm to 50 nm.

The method of the present invention reduces the aforementioned level difference (iso-dense bias) by 5 nm or more, for example, 10 nm or more, for example, 20 nm or more, for example, 30 nm or more, for example, 40 nm or more, for example, 50 nm or more.

The level difference (iso-dense bias) is preferably 5 nm to 55 nm.

The stepped portion of the upper surface of the semiconductor substrate has a step pattern (e.g., a trench pattern and/or a via pattern) having a width of 50 nm or less, for example, 5 nm to 50 nm, for example, 10 nm to 40 nm, for example, 5 nm to 30 nm, for example, 5 nm to 20 nm, for example, 2 nm to 10 nm.

The step pattern (e.g., a trench pattern and/or a via pattern) has a depth of, for example, 500 nm to 50 nm, for example, 300 nm to 100 nm.

<Polymer (A)>

No particular limitation is imposed on the polymer (A) used in the method of the present invention, so long as the polymer is used in a resist underlayer film-forming composition used in a lithography process for producing a semiconductor device.

The polymer may be, for example, a known novolac polymer, acrylic polymer, or methacrylic polymer, and is preferably a novolac polymer.

Preferably, the polymer (A) includes a partial structure of the following Formula (2):

Formula (2)

[wherein $A^1$ is a phenylene group or a naphthylene group; $A^2$ is a phenylene group, a naphthylene group, or an organic group of the following Formula (3):

Formula (3)

(wherein $A^3$ and $A^4$ are each independently a phenylene group or a naphthylene group, and a dotted line is a bond); and a dotted line is a bond] as described in International Publication WO 2016/072316 pamphlet.

More preferably, the polymer (A) includes a unit structure of the following Formula (1):

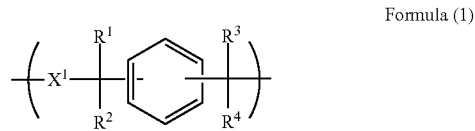

Formula (1)

(wherein $R^1$ to $R^4$ are each independently a hydrogen atom or a methyl group; and $X^1$ is a divalent organic group containing at least one arylene group optionally substituted with an alkyl group, an amino group, or a hydroxyl group).

The resist underlayer film-forming composition of the present invention contains, for example, a polymer including a unit structure of Formula (1) and a solvent.

The polymer including a unit structure of Formula (1) used in the present invention has a weight average molecular weight of 600 to 1,000,000, or 600 to 200,000, or 1,500 to 15,000.

The arylene group is preferably an arylene group derived from a $C_{6-40}$ aryl group. Examples of the arylene group include phenylene group, biphenylene group, terphenylene group, fluorenylene group, naphthylene group, anthrylene group, pyrenylene group, and carbazolylene group.

Examples of the alkyl group include $C_{1-10}$ alkyl groups, such as methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the amino group include a primary amino group, a secondary amino group, and a tertiary amino group. A secondary amino group can be preferably used.

In Formula (1), $X^1$ may be an organic group of Formula (2).

In Formula (2), $A^1$ is a phenylene group or a naphthylene group, and $A^2$ is a phenylene group, a naphthylene group, or an organic group of Formula (3). In Formula (2), a dotted line is a bond.

In Formula (3), $A^3$ and $A^4$ are each independently a phenylene group or a naphthylene group. In Formula (3), a dotted line is a bond.

The polymer used in the present invention is an aromatic methylene compound polymer formed by condensation reaction between an aromatic compound containing a hydroxymethyl group or a methoxymethyl group and an aromatic compound. Examples of the polymer used in the present invention are as follows.

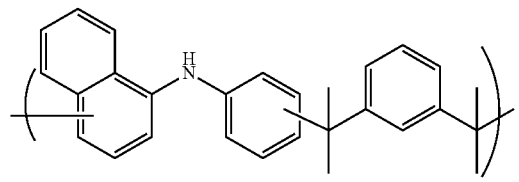

Formual (1-1)

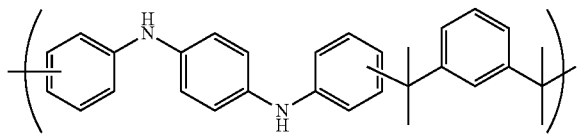

Formual (1-2)

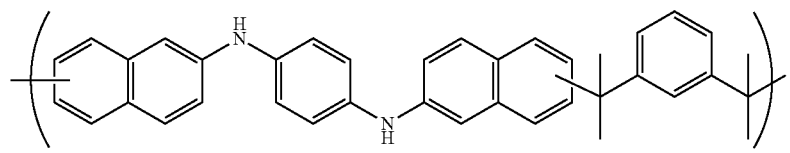

Formual (1-3)

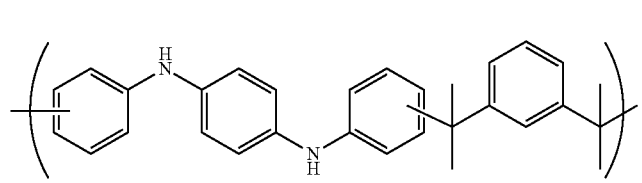

Formual (1-4)

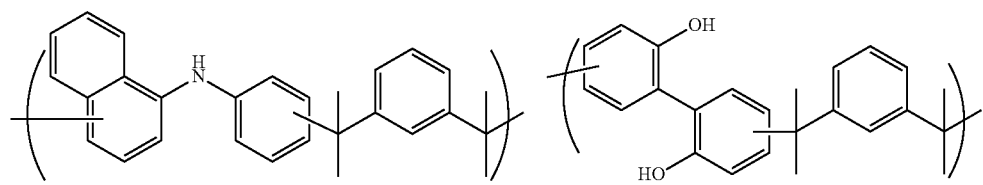

Formual (1-5)

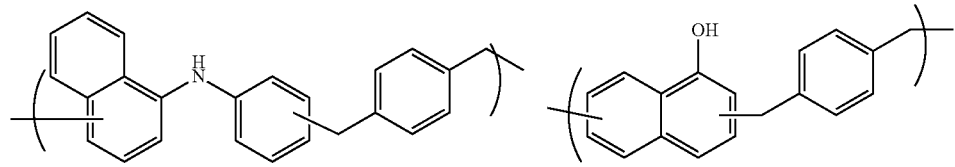

Formual (1-6)

-continued

Formual (1-7)

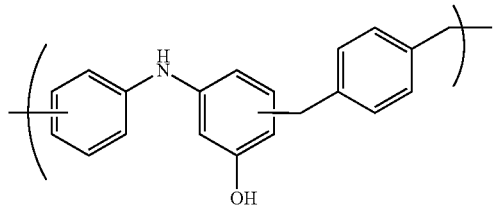

Formual (1-8)

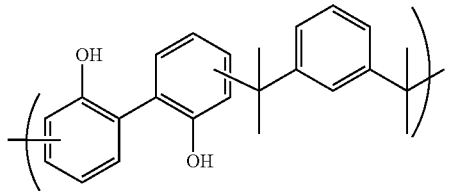

The polymer (A) may contain a novolac resin (described in International Publication WO 2017/069063 pamphlet) prepared by reaction between an aromatic compound (A1) and an aldehyde (B1) having a formyl group bonded to a secondary carbon atom or tertiary carbon atom of a $C_{2-26}$ alkyl group.

The novolac resin used in the present invention has a weight average molecular weight of 500 to 1,000,000 or 600 to 200,000.

The novolac resin used in the present invention contains a novolac resin prepared by reaction between an aromatic compound (A1) and an aldehyde (B1) having a formyl group bonded to a secondary carbon atom or tertiary carbon atom of a $C_{2-26}$ alkyl group.

The novolac resin used in the present invention may include a unit structure of the following Formula (11).

Formula (11)

In Formula (11), $A^{11}$ is a divalent group derived from a $C_{6-40}$ aromatic compound; $b^1$ is a $C_{1-16}$ or $C_{1-6}$ alkyl group; and $b^2$ is a hydrogen atom or a $C_{1-9}$ alkyl group. The unit structure of Formula (11) may have a branched alkyl group wherein $b^1$ and $b^2$ are a $C_{1-16}$ or $C_{1-9}$ alkyl group and a $C_{1-9}$ alkyl group, respectively, or may have a linear alkyl group wherein $b^1$ is a $C_{1-16}$ or $C_{1-9}$ alkyl group and $b^2$ is a hydrogen atom.

$A^{11}$ may be a divalent group derived from an aromatic compound containing an amino group or a hydroxyl group or both of these groups. $A^{11}$ may be a divalent group derived from an aromatic compound containing an arylamine compound or a phenol compound or both of these compounds. More specifically, $A^{11}$ may be a divalent group derived from aniline, diphenylamine, phenylnaphthylamine, hydroxydiphenylamine, carbazole, phenol, N,N'-diphenylethylenediamine, N,N'-diphenyl-1,4-phenylenediamine, or polynuclear phenol.

Examples of the polynuclear phenol include dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, 2,2'-biphenol, and 1,1,2,2-tetrakis(4-hydroxyphenyl)ethane.

The aforementioned novolac resin may include a unit structure of the following Formula (21), which is a more specific form of a unit structure of Formula (11). The characteristic features of a unit structure of Formula (11) are reflected on a unit structure of Formula (21).

Formula (21)

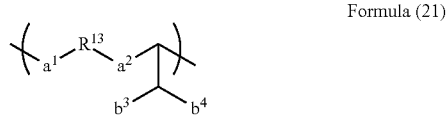

A novolac resin including a unit structure of Formula (21) is prepared by reaction between an aromatic compound (A1') corresponding to the moiety ($a^1$-$R^{13}$-$a^2$) in Formula (21) and an aldehyde (B1) having a formyl group bonded to a secondary carbon atom or tertiary carbon atom of a $C_{2-26}$ alkyl group.

Examples of the aromatic compound (A1') corresponding to the moiety ($a^1$-$R^{13}$-$a^2$) include diphenylamine, phenylnaphthylamine, hydroxydiphenylamine, tris(4-hydroxyphenyl)ethane, N,N'-diphenylethylenediamine, 2,2'-biphenol, and N,N'-diphenyl-1,4-phenylenediamine.

In Formula (21), $a^1$ and $a^2$ are each an optionally substituted benzene ring or naphthalene ring; and $R^{13}$ is a secondary or tertiary amino group, an optionally substituted $C_{1-10}$, $C_{1-6}$, or $C_{1-2}$ divalent hydrocarbon group, an arylene group, or a divalent group prepared by optional bonding of these groups. The arylene group may be an organic group, such as a phenylene group or a naphthylene group. The substituent in $a^1$ and $a^2$ may be a hydroxyl group.

In Formula (21), $b^3$ is a $C_{1-16}$ or $C_{1-9}$ alkyl group, and $b^4$ is a hydrogen atom or a $C_{1-9}$ alkyl group. The unit structure of Formula (21) may have a branched alkyl group wherein $b^3$ and $b^4$ are a $C_{1-16}$ or $C_{1-9}$ alkyl group and a $C_{1-9}$ alkyl group, respectively, or may have a linear alkyl group wherein $b^3$ is a $C_{1-16}$ or $C_{1-9}$ alkyl group and $b^4$ is a hydrogen atom.

In Formula (21), $R^{13}$ may be a secondary amine group or a tertiary amino group. When $R^{13}$ is a tertiary amino group, the tertiary amino group may have a structure substituted with an alkyl group. Of these amino groups, a secondary amino group can be preferably used.

In Formula (21), the optionally substituted $C_{1-10}$, $C_{1-6}$, or $C_{1-2}$ divalent hydrocarbon group represented by $R^{13}$ may be a methylene group or an ethylene group. The substituent may be a phenyl group, a naphthyl group, a hydroxyphenyl group, or a hydroxynaphthyl group.

Examples of the $C_{1-16}$ and $C_{1-9}$ alkyl groups in the aforementioned formula include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, n-hexyl group, n-heptyl group, n-octyl group, n-nonyl group, n-tridecanyl group, and n-hexadecanyl group.

Examples of the $C_{1-16}$ or $C_{1-9}$ alkyl group in the aforementioned formula include those exemplified above, in particular, methyl group, ethyl group, n-propyl group, i-propyl group, n-butyl group, i-butyl group, s-butyl group, and t-butyl group. These groups may be used in combination.

Examples of the aldehyde (B1) used in the present invention are as follows.

Formula (a-1)

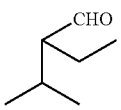

Formula (a-2)

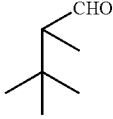

Formula (a-3)

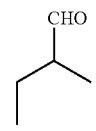

Formula (a-4)

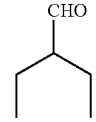

Formula (a-5)

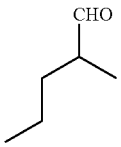

Formula (a-6)

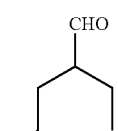

Formula (a-7)

-continued

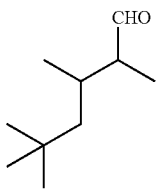

Formula (a-8)

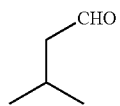

Formula (a-9)

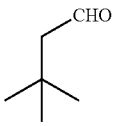

Formula (a-10)

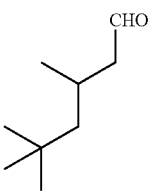

Formula (a-11)

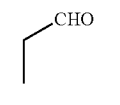

Formula (a-12)

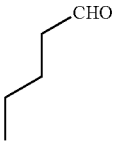

Formula (a-13)

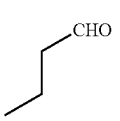

Formula (a-14)

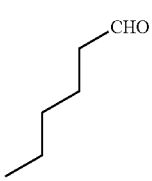

Formula (a-15)

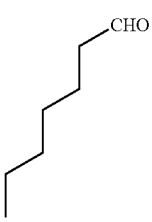

Formula (a-16)

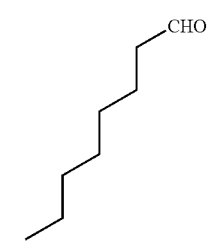
Formula (a-17)

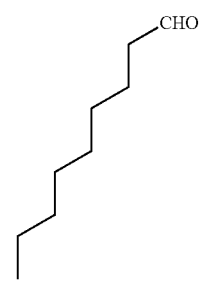
Formula (a-18)

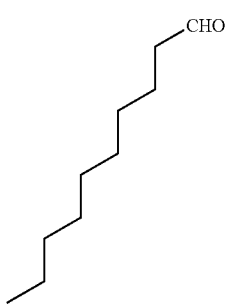
Formula (a-19)

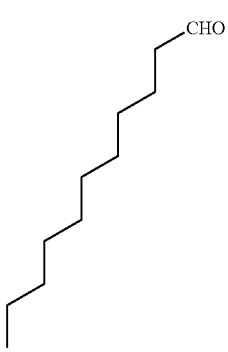
Formula (a-20)

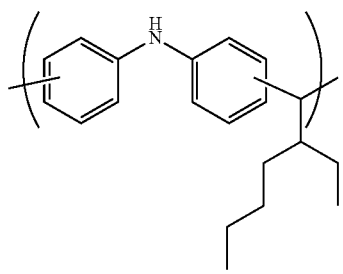
Formula (2-1)

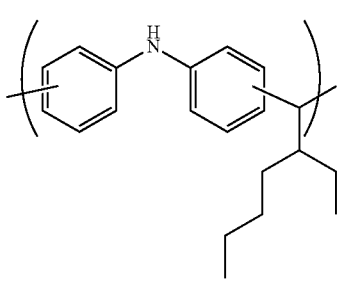
Formula (2-2)

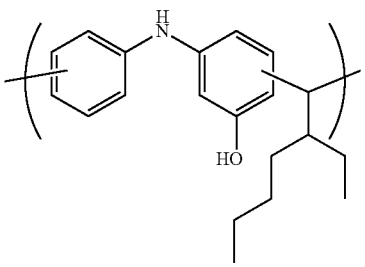
Formula (2-3)

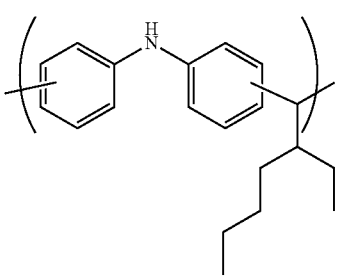

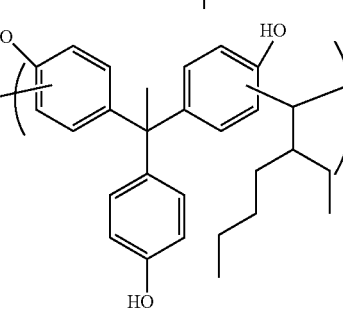
Formula (2-4)

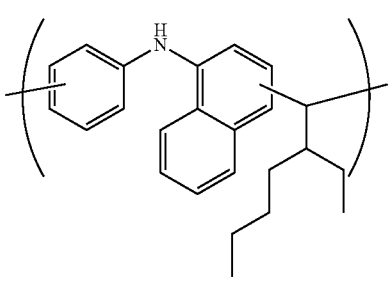

The aromatic compound (A1) is preferably reacted with the aldehyde (B1) at a molar ratio of A1 to B1 of 1:0.5 to 2.0 or 1:1.

The thus-prepared polymer has a weight average molecular weight Mw of generally 500 to 1,000,000 or 600 to 200,000.

Examples of the novolac resin prepared by reaction between the aromatic compound (A1) and the aldehyde (B1) include novolac resins including the following unit structures.

Formula (2-5)
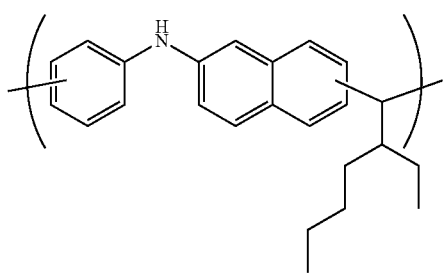

Formula (2-6)
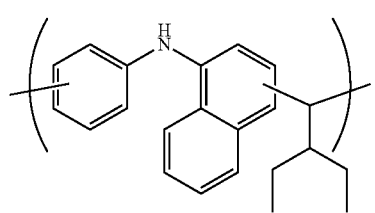

Formula (2-7)
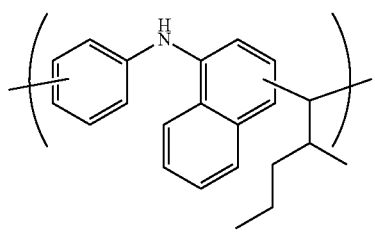

Formula (2-8)
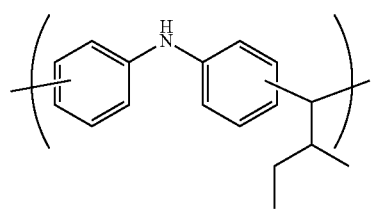

Formula (2-9)
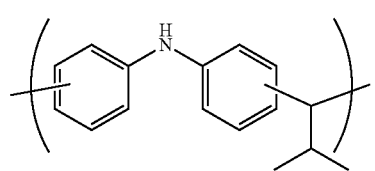

Formula (2-10)
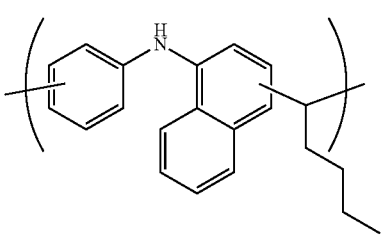

Formula (2-11)
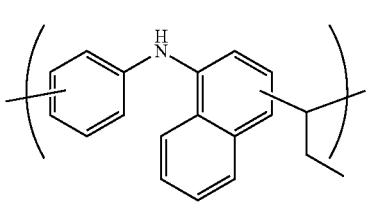

Formula (2-12)
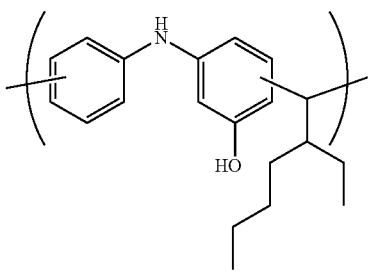

Formula (2-13)
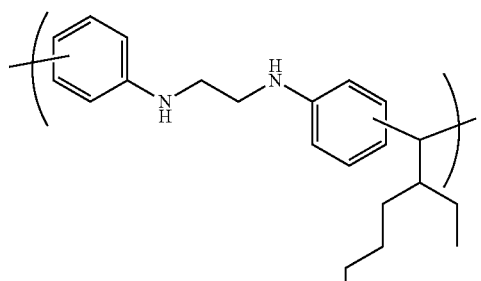

Formula (2-14)
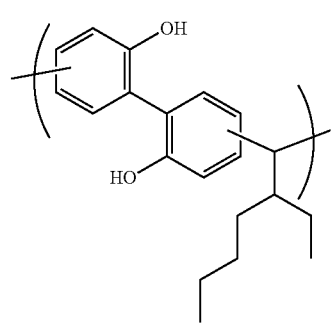

Formula (2-15)
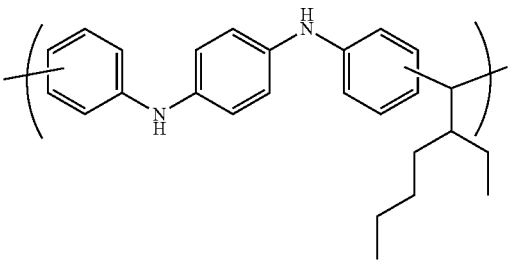

The polymer (A) may contain a novolac polymer (described in International Publication WO 2015/098594 pamphlet) prepared by reaction between an aromatic compound having a secondary amino group and an aldehyde compound.

The resist underlayer film-forming composition of the present invention is a resist underlayer film-forming composition used for a lithography process containing a novolac resin including a unit structure of the following Formula (31).

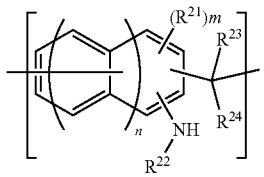

(31)

In the present invention, the resist underlayer film-forming composition for lithography contains the aforementioned polymer and a solvent. The composition may contain a crosslinking agent and an acid, and may optionally contain an additive, such as an acid generator or a surfactant. The composition has a solid content of 0.1 to 70% by mass or 0.1 to 60% by mass. The "solid content" as used herein corresponds to the total amount of all components of the resist underlayer film-forming composition, except for the amount of the solvent. The amount of the aforementioned polymer in the solid content may be 1 to 100% by mass, 1 to 99.9% by mass, 50 to 99.9% by mass, 50 to 95% by mass, or 50 to 90% by mass.

The novolac resin including a unit structure of Formula (31) used in the present invention has a weight average molecular weight of 600 to 1,000,000 or 600 to 200,000.

In Formula (31), $R^{21}$ is a substituent for a hydrogen atom and is a halogen atom, a nitro group, an amino group, a hydroxy group, a $C_{1-10}$ alkyl group, a $C_{2-10}$ alkenyl group, a $C_{6-40}$ aryl group, or any combination of these that optionally contains an ether bond, a ketone bond, or an ester bond; $R^{22}$ is a $C_{1-10}$ alkyl group, a $C_{2-10}$ alkenyl group, a $C_{6-40}$ aryl group, or any combination of these that may contain an ether bond, a ketone bond, or an ester bond; $R^{23}$ is a hydrogen atom, or a $C_{6-40}$ aryl group optionally substituted with a halogen atom, a nitro group, an amino group, a formyl group, a carboxyl group, an alkyl carboxylate group, or a hydroxy group, or a heterocyclic group; $R^{24}$ is a hydrogen atom, or a $C_{1-10}$ alkyl group optionally substituted with a halogen atom, a nitro group, an amino group, a formyl group, a carboxyl group, an alkyl carboxylate group, or a hydroxy group, a $C_{6-40}$ aryl group, or heterocyclic group; $R^{23}$ and $R^{24}$ optionally form a ring together with the carbon atom to which they are bonded; n is an integer of 0 or 1; and m is an integer of 0 to 3 when n is 0, or an integer of 0 to 5 when n is 1.

Examples of the $C_{1-10}$ alkyl group include alkyl groups exemplified above in the discussion regarding Formula (1).

Examples of the $C_{2-10}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the $C_{6-40}$ aryl group include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, 9-phenanthryl group, and pyrenyl group.

The aforementioned heterocyclic group is preferably an organic group composed of a 5- or 6-membered heterocyclic ring containing nitrogen, sulfur, or oxygen. Examples of the heterocyclic group include pyrrole group, furan group, thiophene group, imidazole group, oxazole group, thiazole group, pyrazole group, isoxazole group, isothiazole group, and pyridine group.

Examples of the aforementioned $C_{6-40}$ aryl group optionally substituted with a hydroxy group include phenol, dihydroxybenzene, trihydroxybenzene, naphthol, dihydroxynaphthalene, trihydroxynaphthalene, hydroxyanthracene, dihydroxyanthracene, and trihydroxyanthracene.

Examples of the alkyl group of the aforementioned alkyl carboxylate group include $C_{1-10}$ alkyl groups exemplified above.

The novolac resin may include a unit structure of Formula (31) wherein n and m are zero and $R^{22}$ is a methyl group or a benzyl group. In Formula (31), $R^{22}$ may be an aralkyl group composed of any combination of the aforementioned alkyl groups and aryl groups. Examples of the aralkyl group include benzyl group and phenethyl group.

The novolac resin may include a unit structure of Formula (31) wherein $R^{23}$ is a phenyl group, a naphthyl group, an anthryl group, or a pyrenyl group, and $R^{24}$ is a hydrogen atom. When $R^{23}$ and $R^{24}$ form a ring together with the carbon atom to which they are bonded, the ring is, for example, a fluorene ring.

The novolac resin used in the present invention is prepared through formation of a unit structure of Formula (31) by condensation reaction between an aromatic compound having a secondary amino group and an aldehyde or a ketone.

The aromatic compound having a secondary amino group is, for example, a benzene derivative or a naphthalene derivative, and may have any of the above-exemplified substituents.

Examples of the aldehyde used for producing a polymer in the present invention include saturated aliphatic aldehydes, such as formaldehyde, paraformaldehyde, acetaldehyde, propylaldehyde, butyraldehyde, isobutyraldehyde, valeraldehyde, capronaldehyde, 2-methylbutyraldehyde, hexylaldehyde, undecanaldehyde, 7-methoxy-3,7-dimethyloctylaldehyde, cyclohexanaldehyde, 3-methyl-2-butyraldehyde, glyoxal, malonaldehyde, succinaldehyde, glutaraldehyde, and adipaldehyde; unsaturated aliphatic aldehydes, such as acrolein and methacrolein; heterocyclic aldehydes, such as furfural, pyridinaldehyde, and thiophenaldehyde; and aromatic aldehydes, such as benzaldehyde, naphthylaldehyde, anthrylaldehyde, phenylbenzaldehyde, phenanthrylaldehyde, salicylaldehyde, phenylacetaldehyde, 3-phenylpropionaldehyde, tolylaldehyde, (N,N-dimethylamino)benzaldehyde, acetoxybenzaldehyde, 1-pyrenecarboxaldehyde, anisaldehyde, and terephthalaldehyde. In particular, aromatic aldehydes can be preferably used.

Examples of the ketone used for producing a polymer in the present invention include diaryl ketones, such as diphenyl ketone, phenyl naphthyl ketone, dinaphthyl ketone, phenyl tolyl ketone, ditolyl ketone, and 9-fluorenone.

In this condensation reaction, an aldehyde or a ketone may be used in an amount of 0.1 to 10 mol relative to 1 mol of an aromatic compound having a secondary amino group.

An acid catalyst may be added in an amount of generally 0.001 to 10,000 parts by mass, preferably 0.01 to 1,000 parts by mass, more preferably 0.1 to 100 parts by mass, relative to 100 parts by mass of an aromatic compound having a secondary amino group.

The thus-prepared polymer has a weight average molecular weight Mw of generally 500 to 1,000,000 or 600 to 200,000.

Specific examples of the polymer including a unit structure of Formula (31) are shown below in Formulae (32-1) to (32-12) and (33-1) to (33-12).

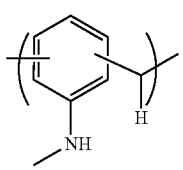

Formula (32-1)

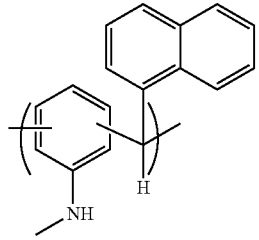

Formula (32-2)

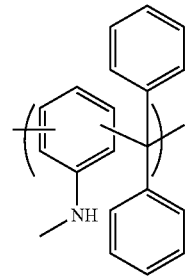

Formula (32-3)

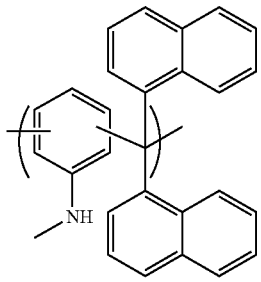

Formula (32-4)

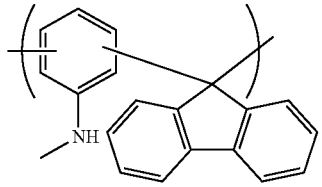

Formula (32-5)

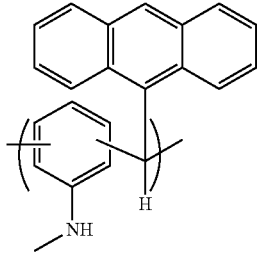

Formula (32-6)

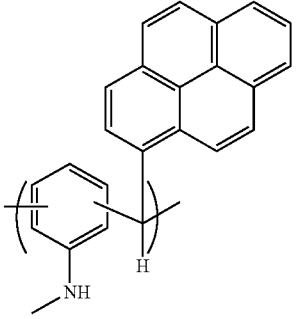

Formula (32-7)

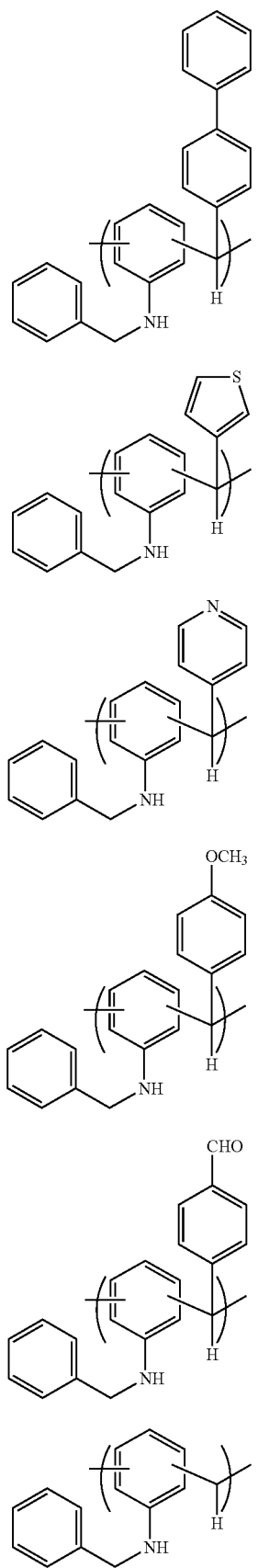
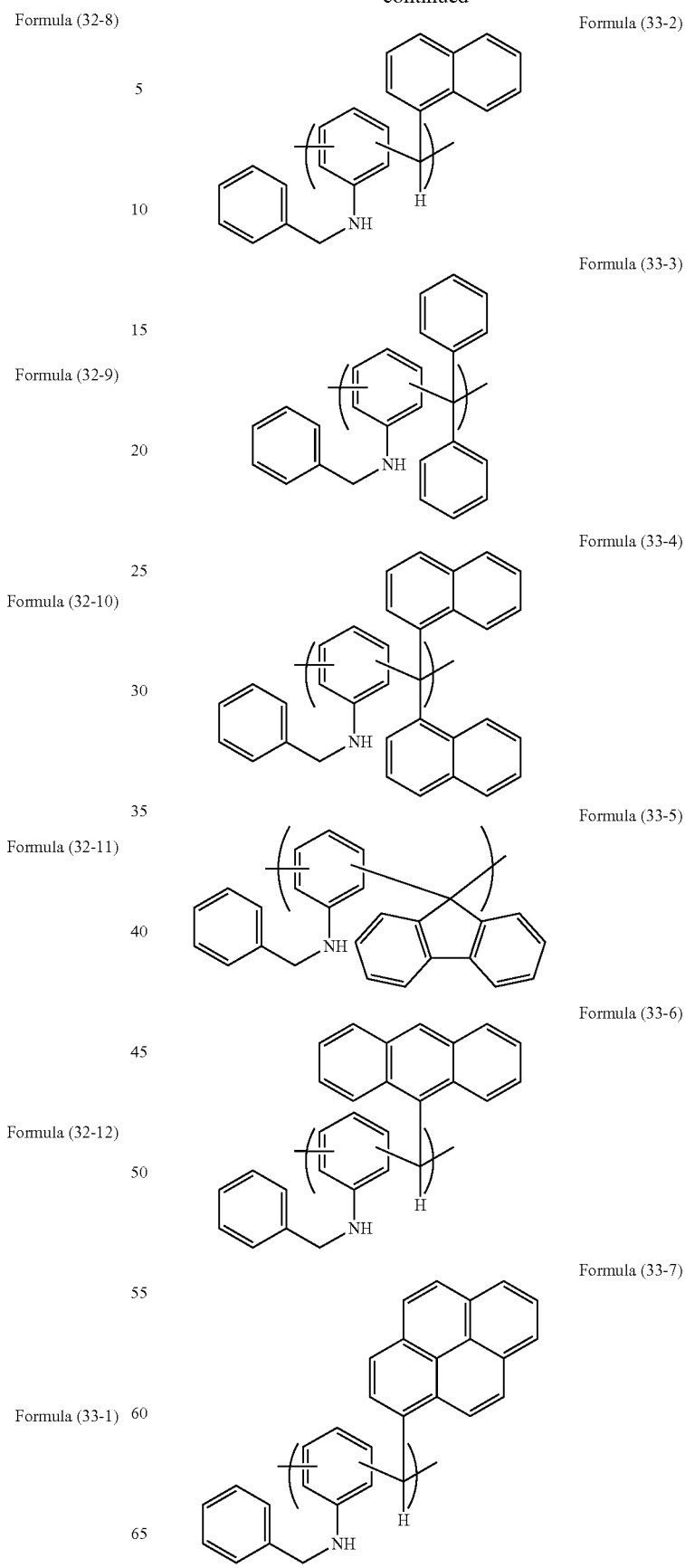

Formula (33-8)

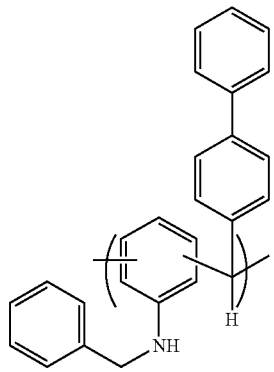

Formula (33-9)

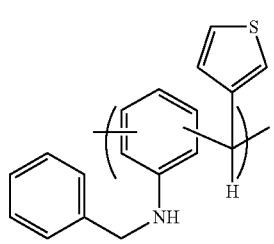

Formula (33-10)

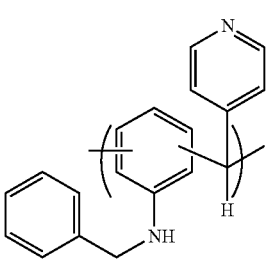

Formula (33-11)

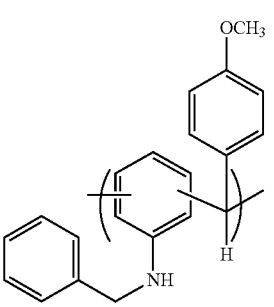

Formula (33-12)

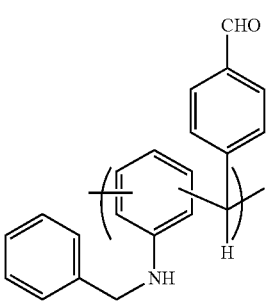

The polymer (A) may be a polymer including a unit structure (A2) of the following Formula (4):

Formula (4)

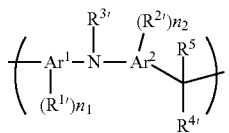

(wherein $Ar^1$ and $Ar^2$ are each a benzene ring or a naphthalene ring; $R^{1\prime}$ and $R^{2\prime}$ are each a substituent for a hydrogen atom on the corresponding ring and is selected from the group consisting of a halogen atom, a nitro group, an amino group, a hydroxy group, a $C_{1-10}$ alkyl group, a $C_{2-10}$ alkenyl group, a $C_{6-40}$ aryl group, and any combination of these, wherein the alkyl group, the alkenyl group, and the aryl group are each an organic group optionally containing an ether bond, a ketone bond, or an ester bond; $R^{3\prime}$ is selected from the group consisting of a hydrogen atom, a $C_{1-10}$ alkyl group, a $C_{2-10}$ alkenyl group, a $C_{6-40}$ aryl group, and any combination of these, wherein the alkyl group, the alkenyl group, and the aryl group are each an organic group optionally containing an ether bond, a ketone bond, or an ester bond; $R^{4\prime}$ is selected from the group consisting of a $C_{6-40}$ aryl group and a heterocyclic group, wherein the aryl group and the heterocyclic group are each an organic group optionally substituted with a halogen atom, a nitro group, an amino group, a $C_{1-10}$ alkyl group, a $C_{1-10}$ alkoxy group, a $C_{6-40}$ aryl group, a formyl group, a carboxyl group, or a hydroxyl group; $R^5$ is selected from the group consisting of a hydrogen atom, a $C_{1-10}$ alkyl group, a $C_{6-40}$ aryl group, and a heterocyclic group, wherein the alkyl group, the aryl group, and the heterocyclic group are each an organic group optionally substituted with a halogen atom, a nitro group, an amino group, or a hydroxyl group; $R^{4\prime}$ and $R^5$ optionally form a ring together with the carbon atom to which they are bonded; and $n_1$ and $n_2$ are each an integer of 0 to 3) as described in International Publication WO 2013/047516 pamphlet.

The aforementioned polymer may include a unit structure of Formula (4) wherein $R^5$ is a hydrogen atom, and $R^{4\prime}$ is an optionally substituted phenyl group, naphthyl group, anthryl group, or pyrenyl group.

The polymer may include a unit structure of Formula (4) wherein $R^{3\prime}$ is a hydrogen atom or a phenyl group.

The polymer may include a unit structure (a1), which is a unit structure (A2) wherein one of $Ar^1$ and $Ar^2$ is a benzene ring, and the other is a naphthalene ring.

The polymer may include a unit structure (a2), which is a unit structure (A2) wherein both of $Ar^1$ and $Ar^2$ are a benzene ring.

The polymer may be a copolymer including the unit structure (a1) and the unit structure (a2).

The polymer may be a copolymer including a unit structure (A2) of Formula (4) and a unit structure (B2) of the following Formula (5):

Formula (5)

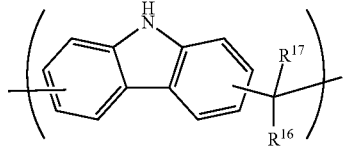

(wherein $R^{16}$ is selected from the group consisting of a $C_{6-40}$ aryl group and a heterocyclic group, wherein the aryl group and the heterocyclic group are each an organic group optionally substituted with a halogen atom, a nitro group, an amino group, a $C_{1-10}$ alkyl group, a $C_{1-10}$ alkoxy group, a $C_{6-40}$ aryl group, a formyl group, a carboxyl group, or a hydroxy group; $R^{17}$ is selected from the group consisting of a hydrogen atom, a $C_{1-10}$ alkyl group, a $C_{6-40}$ aryl group, and a heterocyclic group, wherein the alkyl group, the aryl group, and the heterocyclic group are each an organic group optionally substituted with a halogen atom, a nitro group, an amino group, or a hydroxy group; and $R^{16}$ and $R^{17}$ optionally form a ring together with the carbon atom to which they are bonded).

The polymer (A) of the present invention may be a copolymer including the unit structure (a1) and the unit structure (B2).

Examples of the aforementioned halogen atom include fluorine atom, chlorine atom, bromine atom, and iodine atom.

Examples of the $C_{1-10}$ alkyl group include alkyl groups exemplified above in the discusssion regarding Formula (31).

Examples of the $C_{2-10}$ alkenyl group include alkenyl groups exemplified above in the discussion regarding Formula (31).

Examples of the $C_{1-10}$ alkoxy group include methoxy group, ethoxy group, n-propoxy group, i-propoxy group, n-butoxy group, i-butoxy group, s-butoxy group, t-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group.

Examples of the $C_{6-40}$ aryl group include aryl groups exemplified above in the discussion regarding Formula (31).

The aforementioned heterocyclic group is preferably an organic group composed of a 5- or 6-membered heterocyclic ring containing nitrogen, sulfur, or oxygen. Examples of the heterocyclic group include pyrrole group, furan group, thiophene group, imidazole group, oxazole group, thiazole group, pyrazole group, isoxazole group, isothiazole group, and pyridine group.

Examples of the polymer used in the present invention include compounds of the following Formulae (4-1) to (4-21).

Formula (4-1)

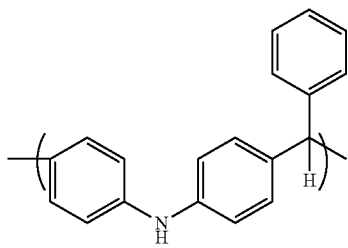

Formula (4-2)

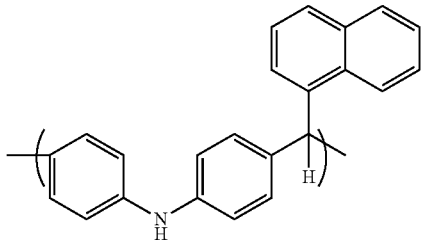

Formula (4-3)

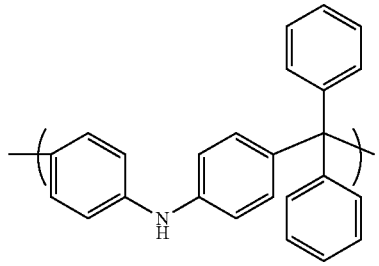

Formula (4-4)

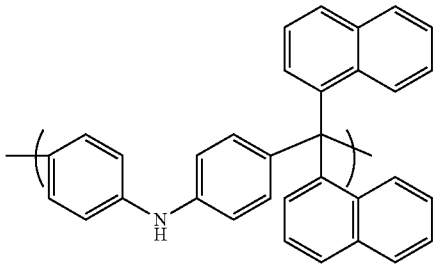

Formula (4-5)

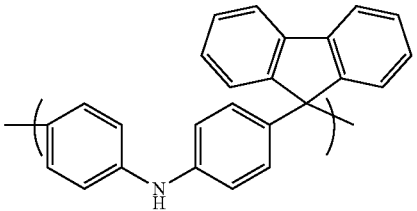

Formula (4-8)

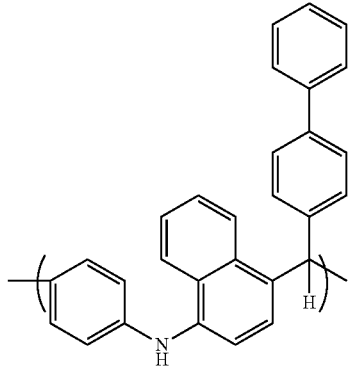

Formula (4-9)

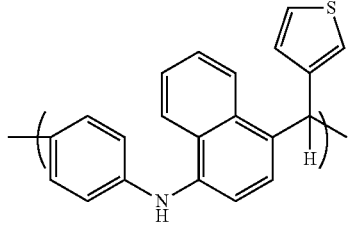

Formula (4-10)
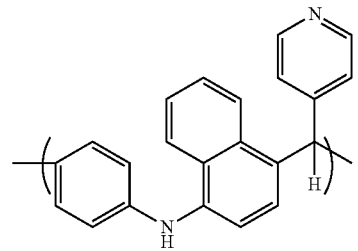
Formula (4-11)
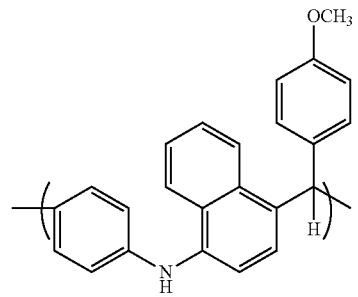
Formula (4-12)
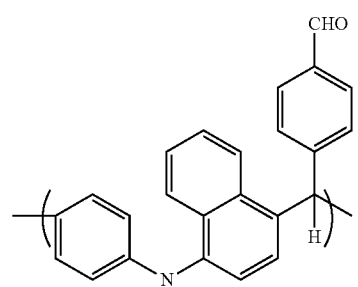
Formula (4-13)
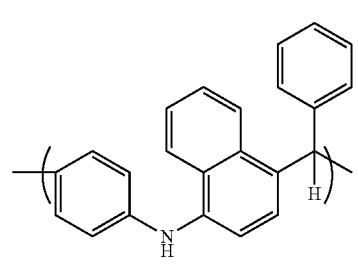
Formula (4-14)
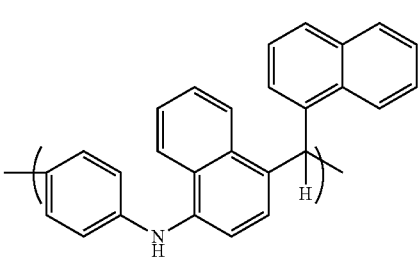
Formula (4-15)
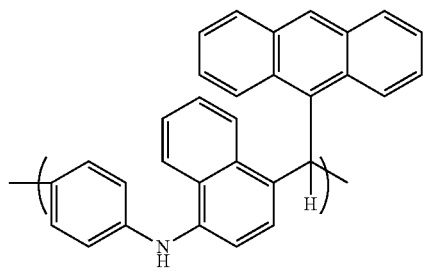
Formula (4-16)
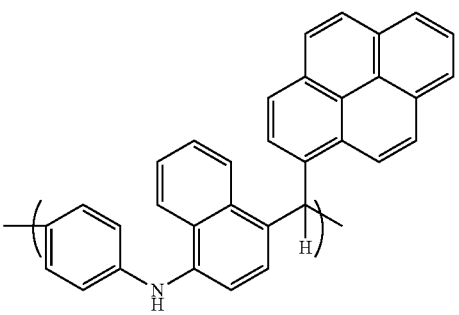
Formula (4-17)
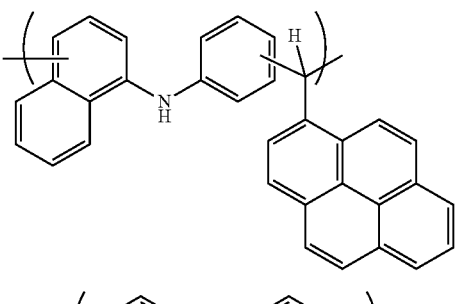
Formula (4-18)
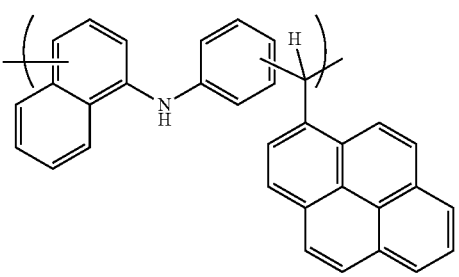
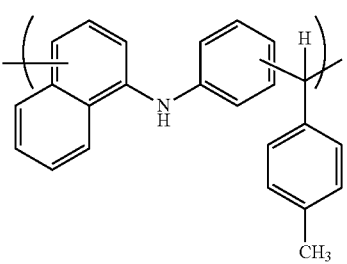

Formula (4-19)

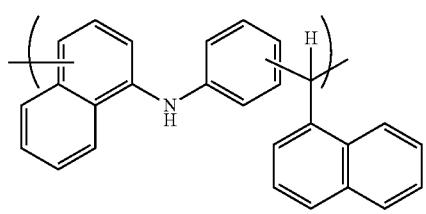

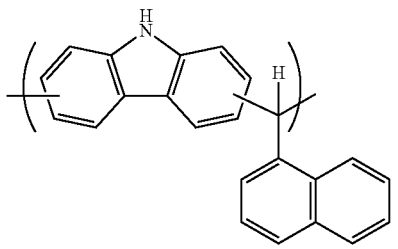

Formula (4-20)

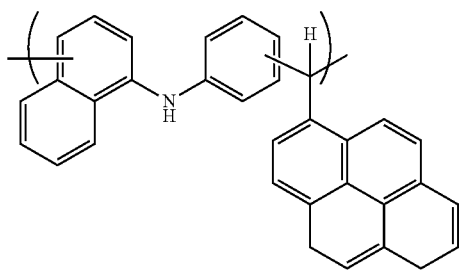

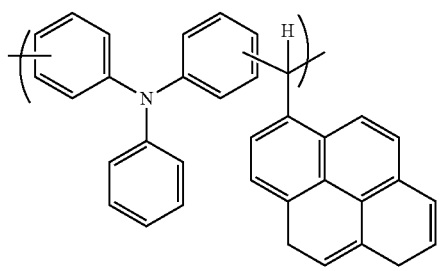

Formula (4-21)

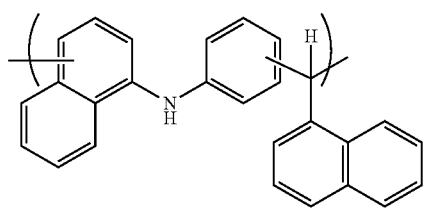

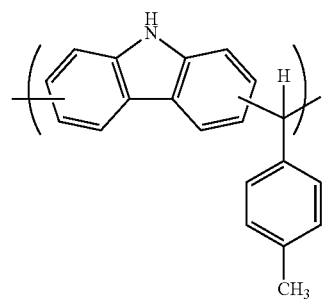

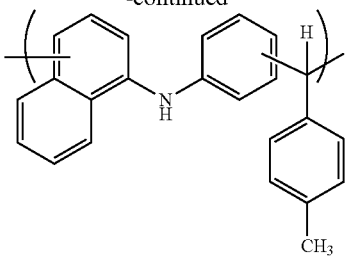

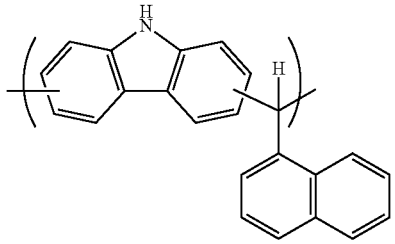

A carbazole compound may be used in the present invention. Examples of the carbazole compound include carbazole; N-methylcarbazole, N-ethylcarbazole, 1,3,6,8-tetranitrocarbazole, 3,6-diaminocarbazole, 3,6-dibromo-9-ethylcarbazole, 3,6-dibromo-9-phenylcarbazole, 3,6-dibromocarbazole, 3,6-dichlorocarbazole, 3-amino-9-ethylcarbazole, 3-bromo-9-ethylcarbazole, 4,4'-bis(9H-carbazol-9-yl)biphenyl, 4-glycidylcarbazole, 4-hydroxycarbazole, 9-(1H-benzotriazol-1-ylmethyl)-9H-carbazole, 9-acetyl-3,6-diiodocarbazole, 9-benzoylcarbazole, 9-benzoylcarbazole-6-dicarboxaldehyde, 9-benzylcarbazole-3-carboxyaldehyde, 9-methylcarbazole, 9-phenylcarbazole, 9-vinylcarbazole, potassium carbazole, carbazole-N-carbonylchloride, N-ethylcarbazole-3-carboxyaldehyde, and N-((9-ethylcarbazol-3-yl)methylene)-2-methyl-1-indolynylamine. These carbazole compounds may be used alone or in combination of two or more species.

A triphenylamine compound may be used in the present invention. Examples of the triphenylamine compound include triphenylamine and substituted triphenylamine. The substituent is, for example, any of the aforementioned halogen atoms, a nitro group, an amino group, a hydroxy group, a $C_{1-10}$ alkyl group, a $C_{2-10}$ alkenyl group, a $C_{6-40}$ aryl group, or any combination of these that optionally contains an ether bond, a ketone bond, or an ester bond.

Examples of the aldehyde used for producing a polymer of Formula (4) in the present invention include aldehydes exemplified above in the discussion regarding formation of the unit structure Formuls (31).

Examples of the ketone used for producing a polymer of Formula (4) in the present invention include ketones exemplified above in the discussion regarding formation of the unit structure of Formula (31).

The polymer used in the present invention is a novolac resin (corresponding to Formula (4)) prepared by condensation reaction between an amine (e.g., diarylamine) and an aldehyde or a ketone.

In this condensation reaction, an aldehyde or a ketone may be used in an amount of 0.1 to 10 equivalents relative to 1 equivalent of a phenyl group of an amine (e.g., diarylamine).

The thus-prepared polymer has a weight average molecular weight Mw of generally 600 to 1,000,000 or 600 to 200,000.

<Crosslinkable Compound (B)>

The resist underlayer film-forming composition used in the present invention may further contain a crosslinkable compound (B).

No particular limitation is imposed on the crosslinkable compound, so long as the compound has reactivity to the reaction moiety of the polymer (A) and can bind molecules of the polymer (A).

The crosslinking agent is, for example, a melamine crosslinking agent, a substituted urea crosslinking agent, or a polymer composed thereof. The crosslinking agent preferably has at least two crosslinking substituents, and is a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea. A condensation product of any of these compounds may be used.

The crosslinking agent may be a crosslinking agent having high thermal resistance. The crosslinking agent having high thermal resistance is preferably a compound containing, in the molecule, a crosslinking substituent having an aromatic ring (e.g., benzene ring or naphthalene ring).

The aforementioned crosslinkable compound (B) is preferably a crosslinkable compound of the following Formula (11-1) or (12-1):

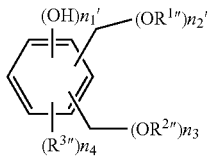

Formula (11-1)

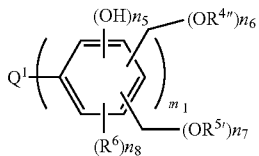

Formula (12-1)

(wherein $Q^1$ is a single bond or an $m_1$-valent organic group; $R^{1\prime\prime}$ and $R^{4\prime\prime}$ are each a $C_{2\text{-}10}$ alkyl group, or a $C_{2\text{-}10}$ alkyl group having a $C_{1\text{-}10}$ alkoxy group; $R^{2\prime\prime}$ and $R^{5\prime}$ are each a hydrogen atom or a methyl group; $R^{3\prime\prime}$ and $R^6$ are each a $C_{1\text{-}10}$ alkyl group or a $C_{6\text{-}40}$ aryl group; $n_1{}'$ is an integer satisfying a relation of $1 \le n_1{}' \le 3$, $n_2{}'$ is an integer satisfying a relation of $2 \le n_2{}' \le 5$, $n_3$ is an integer satisfying a relation of $0 \le n_3 \le 3$, $n_4$ is an integer satisfying a relation of $0 \le n_4 \le 3$, and a relation of $3 \le (n_1{}'+n_2{}'+n_3+n_4) \le 6$ is satisfied; and $n_5$ is an integer satisfying a relation of $1 \le n_5 \le 3$, $n_6$ is an integer satisfying a relation of $1 \le n_6 \le 4$, $n_7$ is an integer satisfying a relation of $0 \le n_7 \le 3$, $n_8$ is an integer satisfying a relation of $0 \le n_8 \le 3$, and a relation of $2 \le (n_5+n_6+n_7+n_8) \le 5$ is satisfied; and $m_1$ is an integer of 2 to 10) as described in International Publication WO 2014/208542 pamphlet.

In the aforementioned formulae, $Q^1$ may be a single bond or an $m_1$-valent organic group selected from a chain hydrocarbon group having a carbon atom number of 1 to 10, a $C_{6\text{-}40}$ aromatic group, or any combination thereof. Examples of the chain hydrocarbon group include alkyl groups described below. Examples of the aromatic group include aryl groups described below.

The crosslinkable compound of Formula (11-1) or (12-1) may be a reaction product between a hydroxyl-group-containing ether compound or a $C_{2\text{-}10}$ alcohol and a compound of the following Formula (13) or (14):

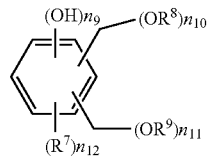

Formula (13)

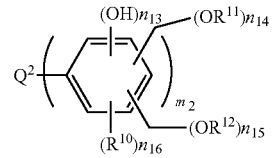

Formula (14)

(wherein $Q^2$ is a single bond or an $m_2$-valent organic group; $R^8$, $R^9$, $R^{11}$, and $R^{12}$ are each a hydrogen atom or a methyl group; $R^7$ and $R^0$ are each a $C_{1\text{-}10}$ alkyl group or a $C_{6\text{-}40}$ aryl group; $n_9$ is an integer satisfying a relation of $1 \le n_9 \le 3$, $n_{10}$ is an integer satisfying a relation of $2 \le n_{10} \le 5$, $n_{11}$ is an integer satisfying a relation of $0 \le n_{11} \le 3$, $n_{12}$ is an integer satisfying a relation of $0 \le n_{12} \le 3$, and a relation of $3 \le (n_9+n_{10}+n_{11}+n_{12}) \le 6$ is satisfied; and $n_{13}$ is an integer satisfying a relation of $1 \le n_{13} \le 3$, $n_{14}$ is an integer satisfying a relation of $1 \le n_{14} \le 4$, $n_{15}$ is an integer satisfying a relation of $0 \le n_{15} \le 3$, $n_{16}$ is an integer satisfying a relation of $0 \le n_{16} \le 3$, and a relation of $2 \le (n_{13}+n_{14}+n_{15}+n_{16}) \le 5$ is satisfied; and $m_2$ is an integer of 2 to 10).

Examples of the $C_{1\text{-}10}$ alkyl group include $C_{1\text{-}10}$ alkyl groups exemplified above.

Examples of the $C_{2\text{-}10}$ alkyl group include $C_{2\text{-}10}$ alkyl groups among $C_{1\text{-}10}$ alkyl groups exemplified above.

Examples of the $C_{1\text{-}10}$ alkoxy group include alkoxy groups exemplified above in the discussion regarding Formula (5).

The aforementioned hydroxyl-group-containing ether compound is propylene glycol monomethyl ether or propylene glycol monoethyl ether.

The aforementioned $C_{2\text{-}10}$ alcohol is ethanol, 1-propanol, 2-methyl-1-propanol, butanol, 2-methoxyethanol, or 2-ethoxyethanol.

Examples of the $C_{6\text{-}40}$ aryl group include aryl groups exemplified above in the disccusion regarding Formula (31). The crosslinkable compound of Formula (11-1) or (12-1) can be prepared by reaction between a compound of Formula (13) or (14) and the aforementioned hydroxyl-group-containing ether compound or the aforementioned $C_{2\text{-}10}$ alcohol.

As used herein, the term "mono-substituted form" refers to a compound of Formula (11-1) or (12-1) prepared by reaction between 1 mol of a compound of Formula (13) or (14) and 1 mol of the aforementioned hydroxyl-group-containing ether compound or $C_{2\text{-}10}$ alcohol; the term "di-substituted form" refers to a compound of Formula (11-1) or (12-1) prepared by reaction between 1 mol of a compound of Formula (13) or (14) and 2 mol of the aforementioned hydroxyl-group-containing ether compound or $C_{2\text{-}10}$ alcohol; the term "tri-substituted form" refers to a compound of Formula (11-1) or (12-1) prepared by reaction between 1 mol of a compound of Formula (13) or (14) and 3 mol of the aforementioned hydroxyl-group-containing ether compound or $C_{2-10}$ alcohol; and the term "tetra-substituted form" refers to a compound of Formula (11-1) or (12-1) prepared by reaction between 1 mol of a compound of Formula (13) or (14) and 4 mol of the aforementioned hydroxyl-group-containing ether compound or $C_{2-10}$ alcohol.

In Formulae (13) and (14), $Q^2$ is a single bond or an $m_2$-valent organic group. Specifically, $Q^2$ may be a single bond, or may be an $m_2$-valent organic group selected from a chain hydrocarbon group having a carbon atom number of 1 to 10, a $C_{6-40}$ aromatic group, or any combination thereof. Examples of the chain hydrocarbon group include alkyl groups described above. Examples of the aromatic group include aryl groups described above.

In Formulae (13) and (14), $R^8$, $R^9$, $R^{11}$, and $R^{12}$ are each a hydrogen atom or a methyl group; $R^7$ and $R^{10}$ are each a $C_{1-10}$ alkyl group or a $C_{6-40}$ aryl group; $n_9$ is an integer satisfying a relation of $1 \leq n_9 \leq 3$, $n_{10}$ is an integer satisfying a relation of $2 \leq n_{10} \leq 5$, $n_{11}$ is an integer satisfying a relation of $0 \leq n_{11} \leq 3$, $n_{12}$ is an integer satisfying a relation of $0 \leq n_{12} \leq 3$, and a relation of $3 \leq (n_9+n_{10}+n_{11}+n_{12}) \leq 6$ is satisfied.

In Formulae (13) and (14), $n_{13}$ is an integer satisfying a relation of $1 \leq n_{13} \leq 3$, $n_{14}$ is an integer satisfying a relation of $1 \leq n_{14} \leq 4$, $n_{15}$ is an integer satisfying a relation of $0 \leq n_{15} \leq 3$, $n_{16}$ is an integer satisfying a relation of $0 \leq n_{16} \leq 3$, and a relation of $2 \leq (n_{13}+n_{14}+n_{15}+n_{16}) \leq 5$ is satisfied; and $m_2$ is an integer of 2 to 10.

The reaction between a compound of Formula (13) or (14) and the hydroxyl-group-containing ether compound or the $C_{2-10}$ alcohol is performed in the presence of an acid catalyst.

Examples of crosslinkable compounds of Formulae (11-1) and (12-1) used in the present invention are as follows.

Formula (b-1)

Formula (b-2)

Formula (b-3)

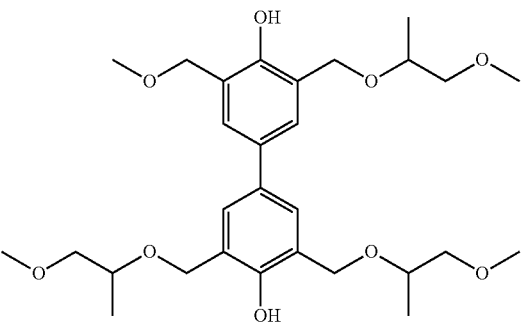

Formula (b-4)

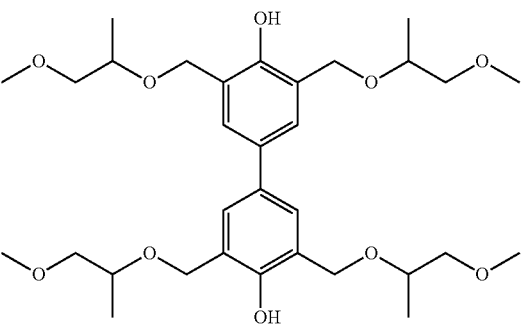

Formula (b-5)

Formula (b-6)

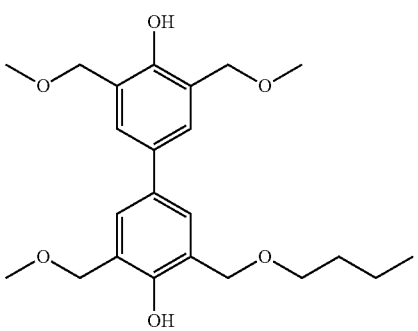

Formula (b-7)
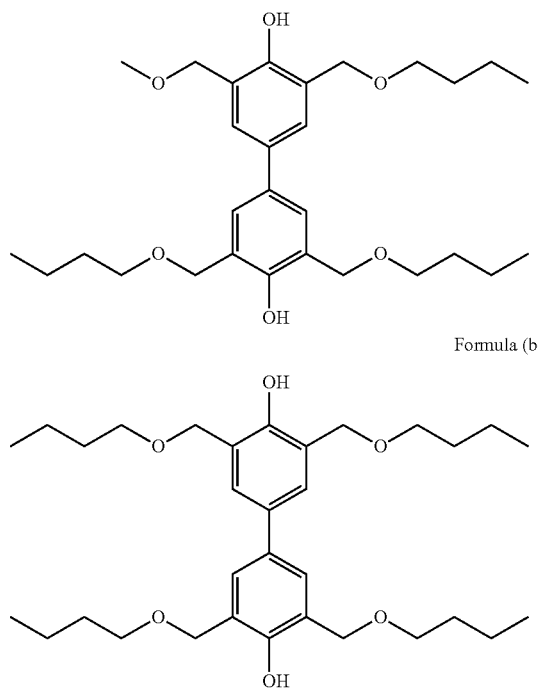
Formula (b-8)
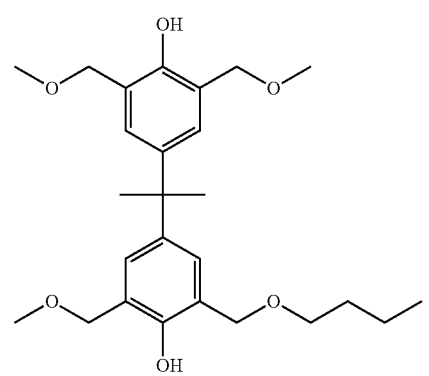
Formula (b-9)
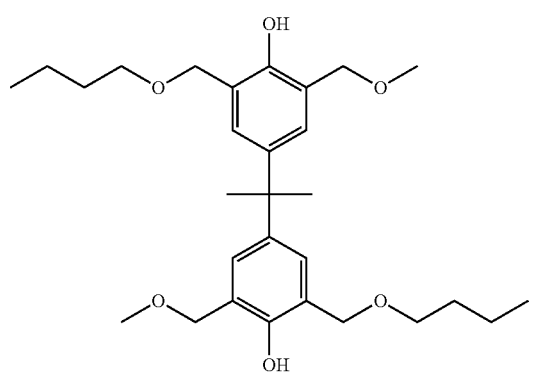
Formula (b-11)
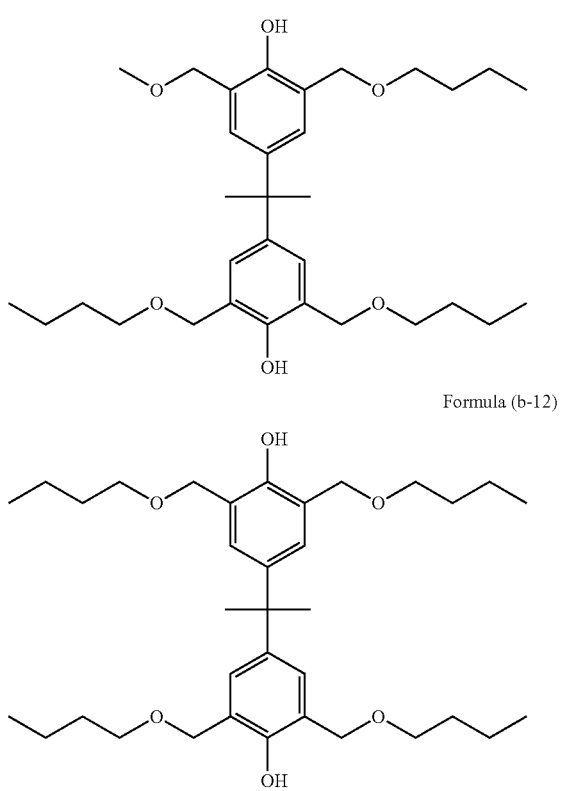
Formula (b-12)
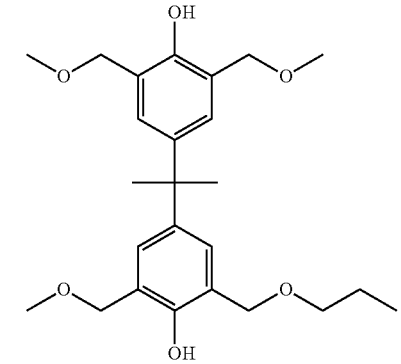
Formula (b-13)
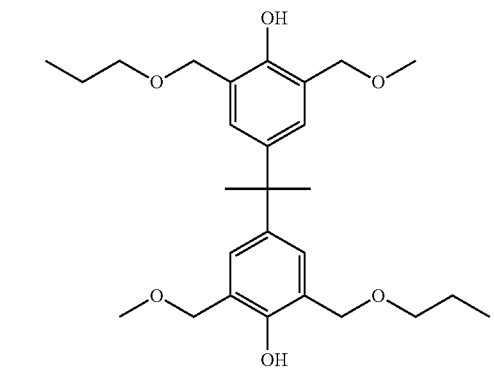
Formula (b-10)
Formula (b-14)

Formula (b-15)
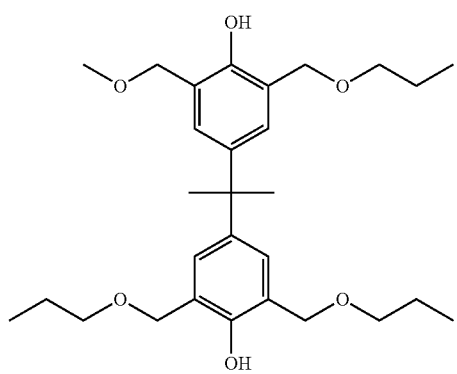
Formula (b-16)
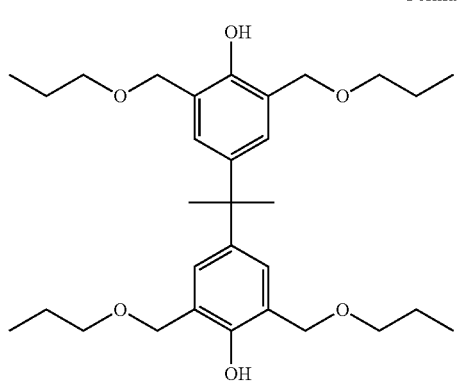
Formula (b-17)
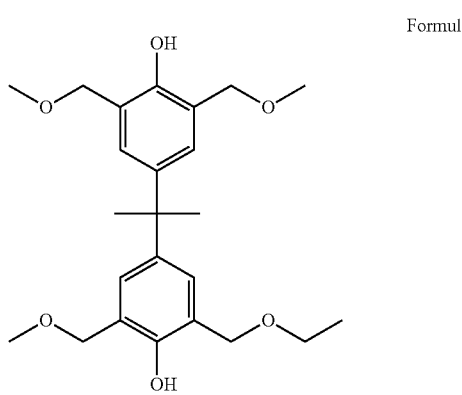
Formula (b-18)
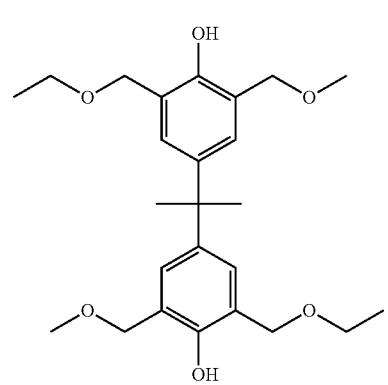
Formula (b-19)
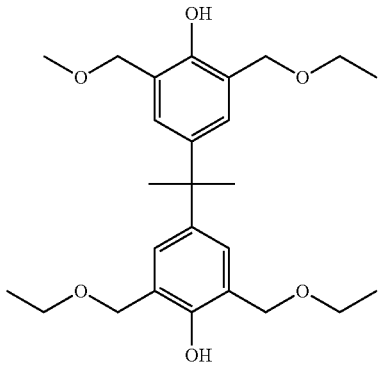
Formula (b-20)
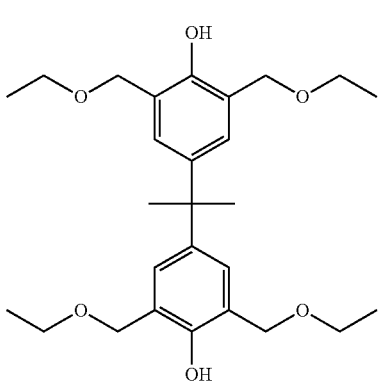
Formula (b-21)
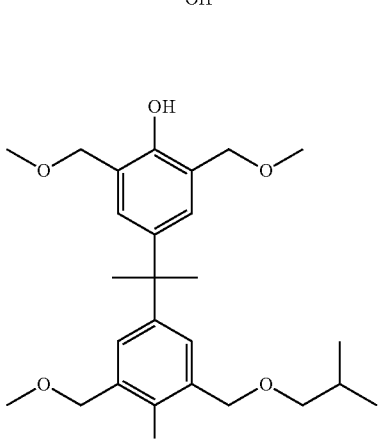
Formula (b-22)
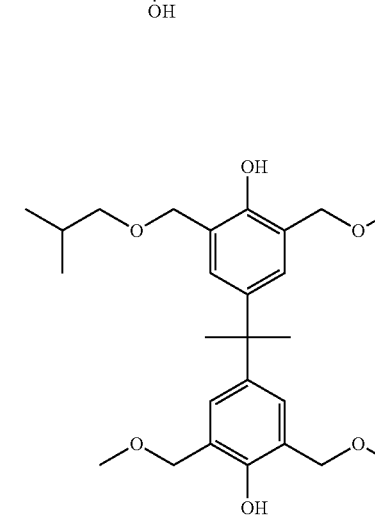

Formula (b-23)
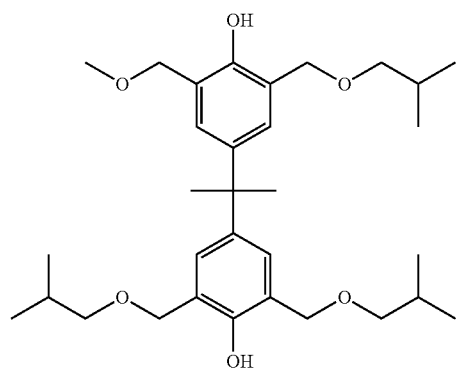
Formula (b-24)
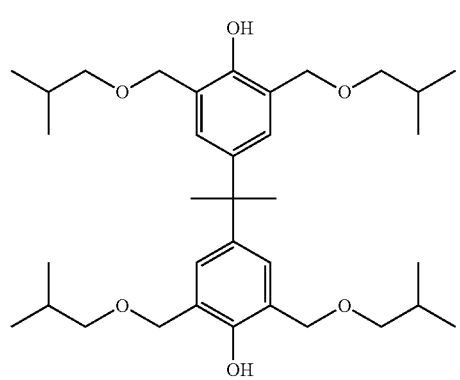
Formula (b-25)
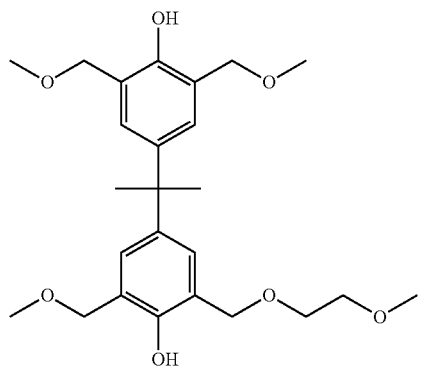
Formula (b-26)
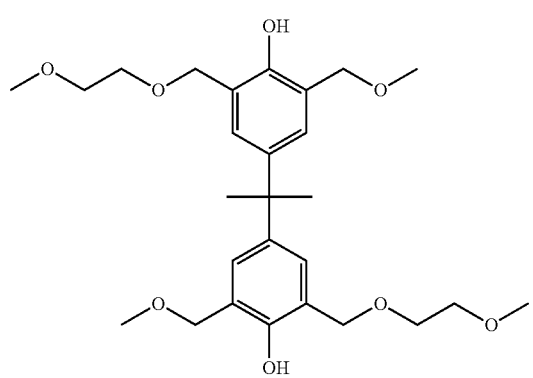
Formula (b-27)
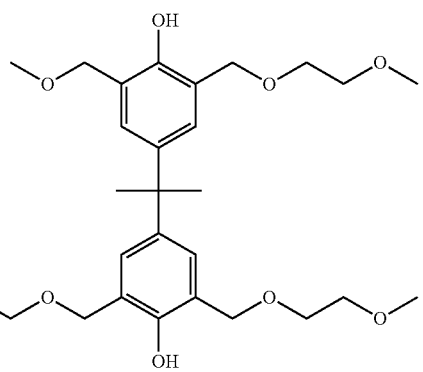
Formula (b-28)
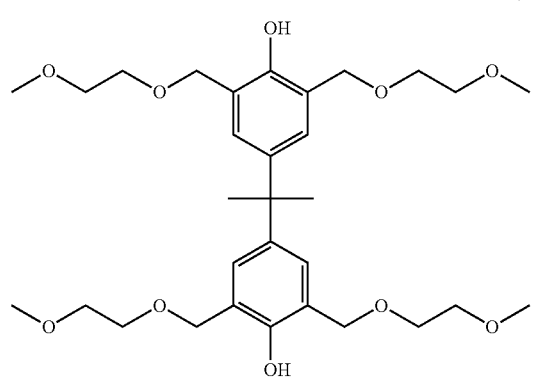
Formula (b-29)
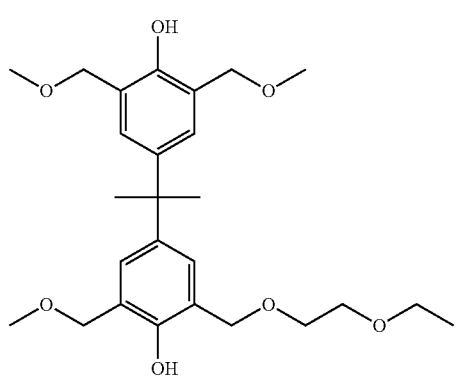
Formula (b-30)
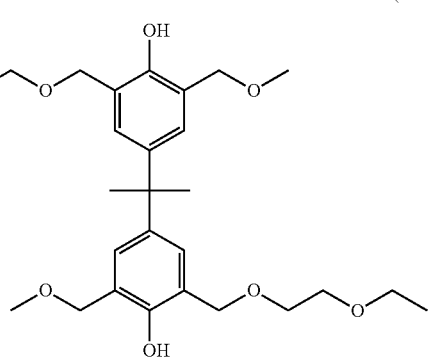

Formula (b-31)
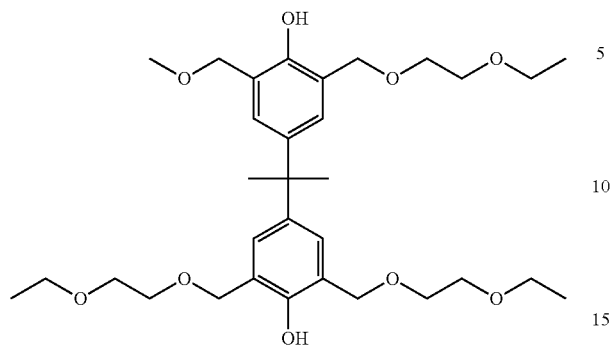
Formula (b-32)
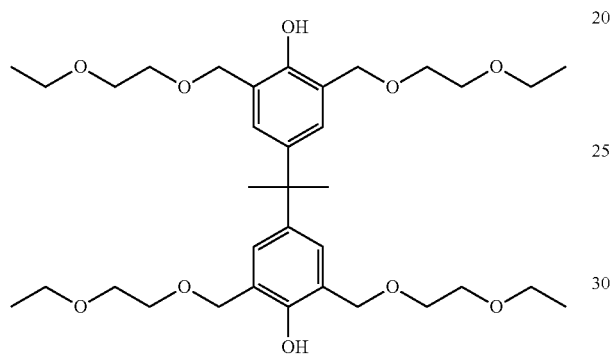
Formula (b-33)
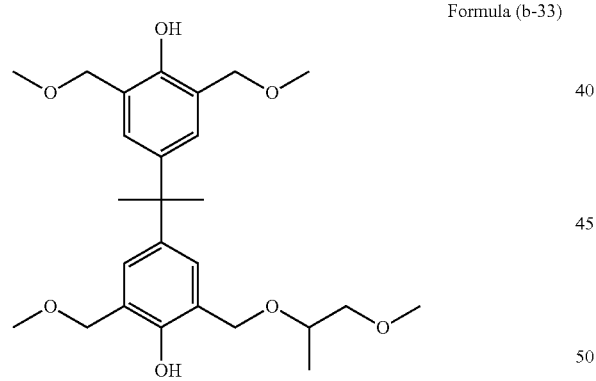
Formula (b-34)
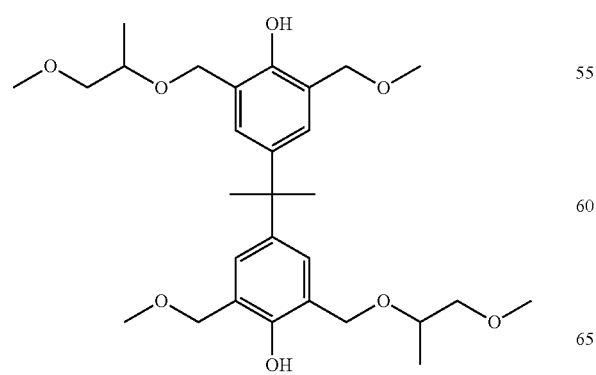
Formula (b-35)
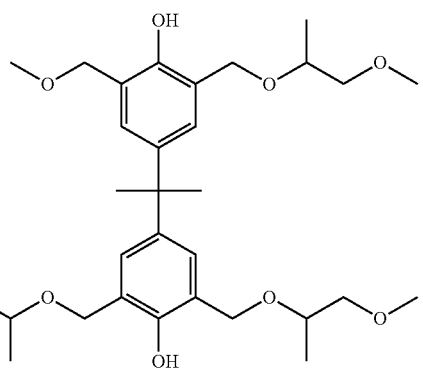
Formula (b-36)
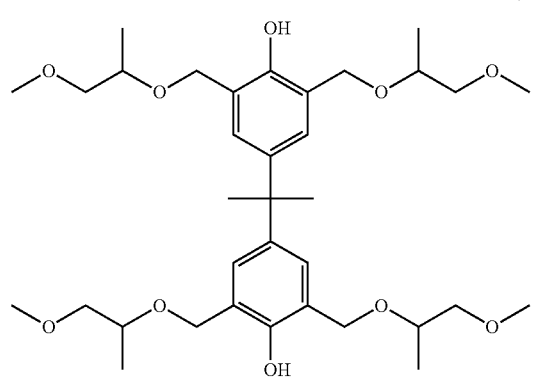
Formula (b-37)
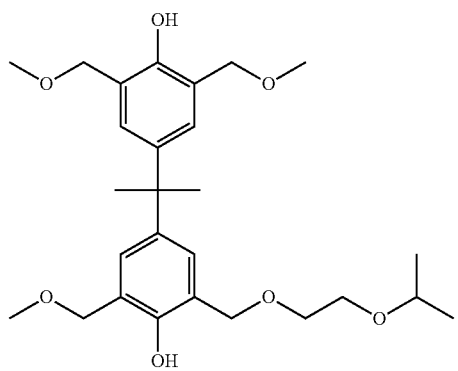
Formula (b-38)
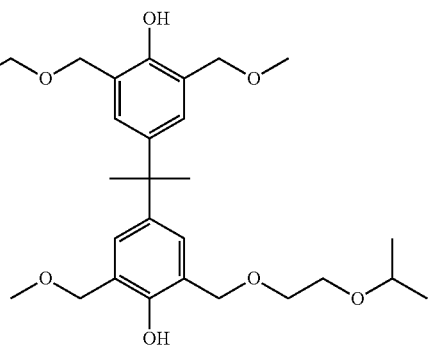

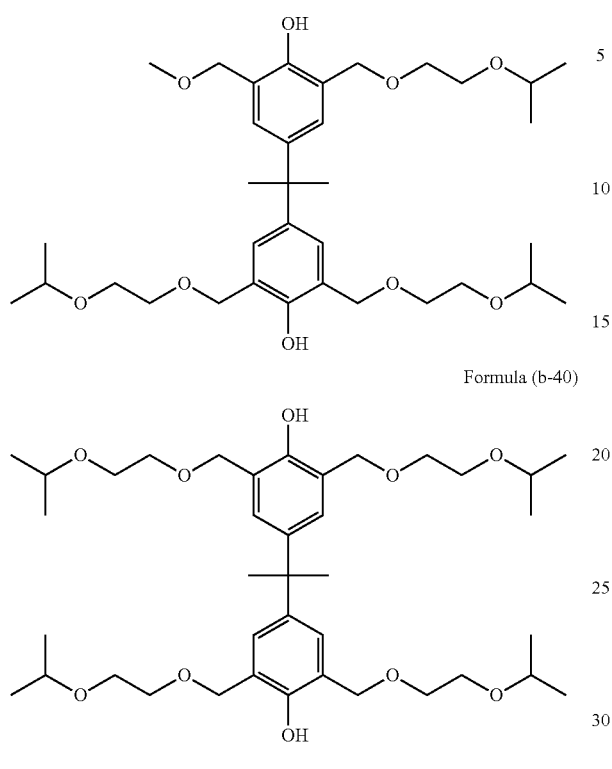
Formula (b-39)
Formula (b-40)
Examples of compounds of Formulae (13) and (14) used in the present invention are as follows.
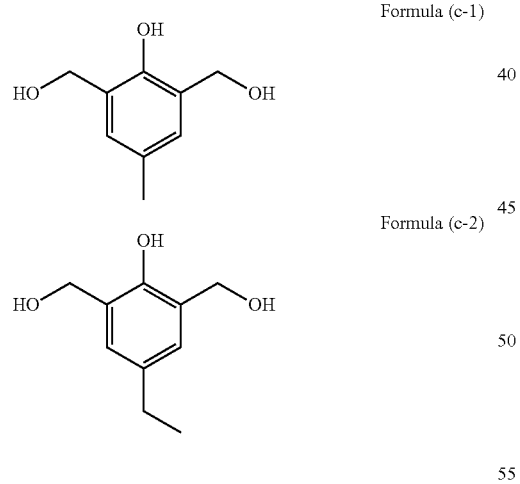
Formula (c-1)
Formula (c-2)
Formula (c-3)
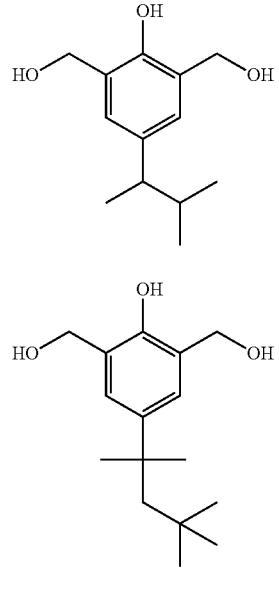
Formula (c-4)
Formula (c-5)
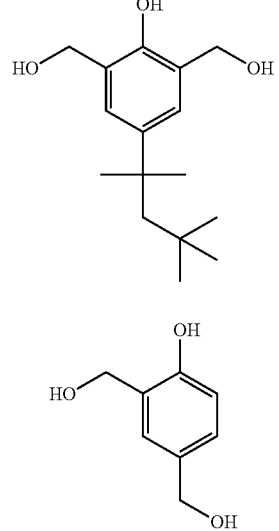
Formula (c-6)
Formula (c-7)
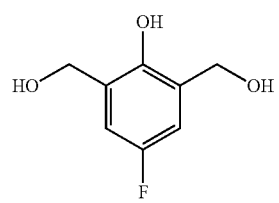
Formula (c-8)
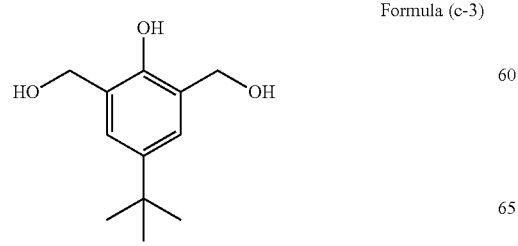
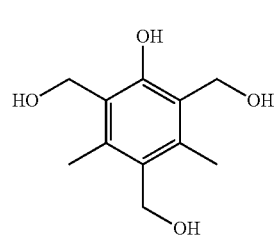
Formula (c-9)

-continued
Formula (c-10)
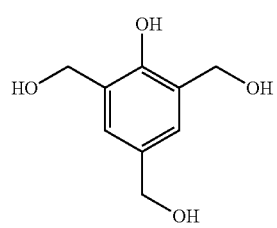
Formula (c-11)
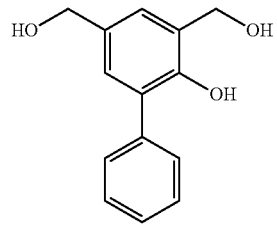
Formula (c-12)
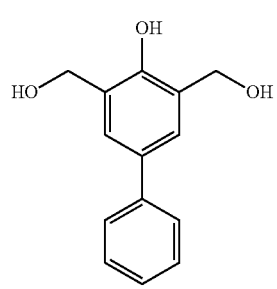
Formula (c-13)
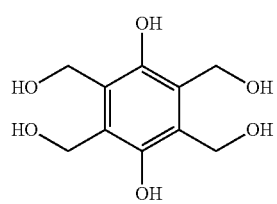
Formula (c-14)
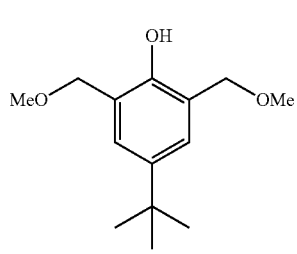
Formula (c-15)
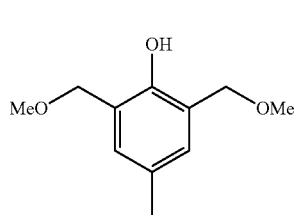
Formula (c-16)
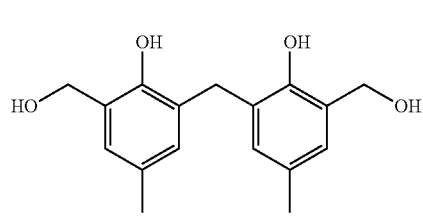
Formula (c-17)
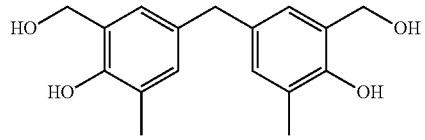
Formula (c-18)
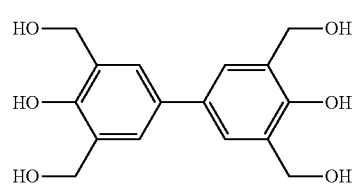
Formula (c-19)
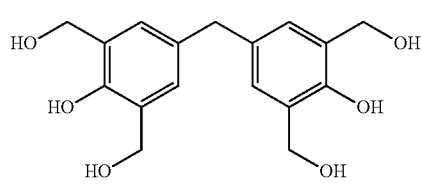
Formula (c-20)
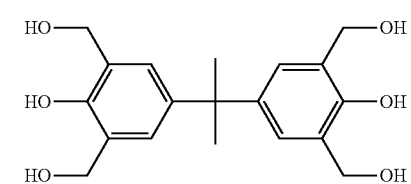
Formula (c-21)
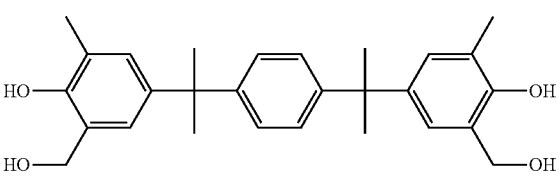
Formula (c-22)
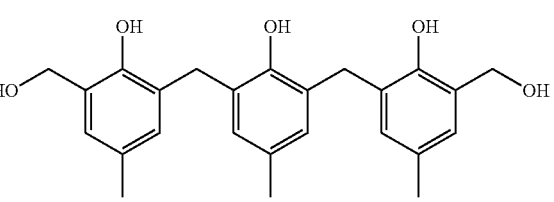
Formula (c-23)
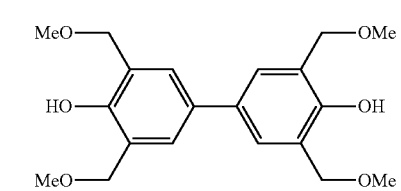
Formula (c-24)
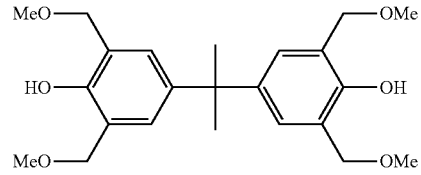

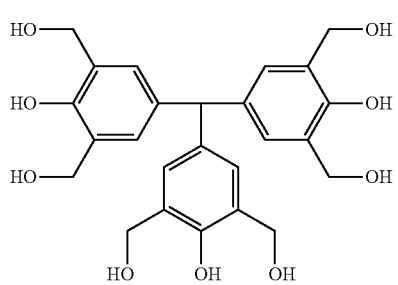

Formula (c-25)

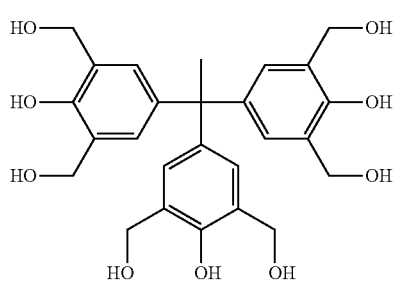

Formula (c-26)

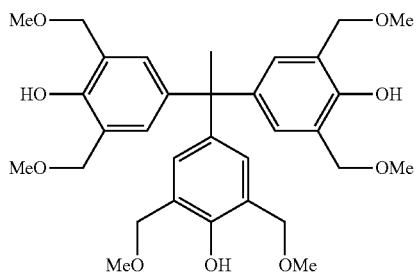

Formula (c-27)

Among the aforementioned crosslinking agents, for example, the compound of Formula (c-23) can be obtained as trade name TMOM-BP (available from Honshu Chemical Industry Co., Ltd.), and the compound of Formula (c-24) can be obtained as trade name TM-BIP-A (available from ASAHI YUKIZAI CORPORATION).

<Solvent (D)>

Examples of the solvent that can be used for dissolving, for example, the aforementioned polymer and crosslinking agent components, or the crosslinking catalyst in the present invention include ethylene glycol monomethyl ether, ethylene glycol monoethyl ether, ethylene glycol monobutyl ether, ethylene glycol monoisopropyl ether, ethylene glycol methyl ether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-buthanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl isopropyl ketone, diethyl ketone, methyl isobutyl ketone, methyl normal butyl ketone, isopropyl acetate ketone, normal propyl acetate, isobutyl acetate, methanol, ethanol, isopropanol, tert-butanol, allyl alcohol, normal propanol, 2-methyl-2-butanol, isobutanol, normal butanol, 2-methyl-1-butanol, 1-pentanol, 2-methyl-1-pentanol, 2-ethylhexanol, isopropyl ether, 1,4-dioxane, N,N-dimethylformamide, N,N-dimethylacetamide, N-methylpyrrolidone, 1,3-dimethyl-2-imidazolidinone, dimethyl sulfoxide, and N-cyclohexyl-2-pyrrolidinone. These organic solvents may be used alone or in combination of two or more species.

<Fluorine-Containing Surfactant (C)>

Examples of the fluorine-containing surfactant used in the present invention include EFTOP [registered trademark] EF301, EF303, and EF352 (available from Mitsubishi Materials Electronic Chemicals Co., Ltd.), MEGAFAC [registered trademark] F171, F173, R-30, R-30N, R-40, and R-40LM (available from DIC Corporation), Fluorad FC430 and FC431 (available from Sumitomo 3M Limited), Asahi Guard [registered trademark] AG710, and SURFLON [registered trademark] S-382, SC101, SC102, SC103, SC104, SC105, and SC106 (available from Asahi Glass Co., Ltd.). The composition may contain one species selected from these surfactants, or two or more species selected therefrom in combination. The surfactant content is, for example, 0.01% by mass to 5% by mass relative to the solid content of the resist underlayer film-forming composition of the present invention; i.e., the total amount of all components of the composition, except for the amount of the solvent described below.

<Additional Components>

The resist underlayer film-forming composition of the present invention may further contain an acidic compound. The acidic compound functions as a catalyst for promoting a crosslinking reaction. Examples of the acidic compound include sulfonic acid compounds and carboxylic acid compounds, such as p-toluenesulfonic acid, trifluoromethanesulfonic acid, pyridinium-p-toluenesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid; and inorganic acids, such as hydrochloric acid, sulfuric acid, nitric acid, and phosphoric acid. The composition may further contain a commercially available thermal acid generator (e.g., K-PURE TAG-2689 (available from King Industries Inc.), which is a trifluoromethanesulfonic acid compound). The composition may contain such a thermal acid generator in place of or in addition to any of the aforementioned acidic compounds. The thermal acid generator also functions as a catalyst for promoting a crosslinking reaction. The thermal acid generator may be, for example, a quaternary ammonium salt of trifluoromethanesulfonic acid. The composition may contain one species selected from these acidic compounds and thermal acid generators, or two or more species selected therefrom in combination. The amount of the acidic compound and/or the thermal acid generator is, for example, 0.1% by mass to 20% by mass relative to the solid content of the resist underlayer film-forming composition of the present invention; i.e., the total amount of all components of the composition, except for the amount of the solvent described above.

<Production Method for Resist Underlayer Film and Semiconductor Device>

Next will be described methods for producing a resist underlayer film and a semiconductor device from the resist underlayer film-forming composition of the present invention.

The resist underlayer film of the present invention can be produced by application of the aforementioned resist underlayer film-forming composition onto a semiconductor substrate, and baking of the composition.

The resist underlayer film-forming composition of the present invention is applied onto a substrate used for the production of a semiconductor device (a semiconductor substrate, for example, a silicon wafer substrate, a silicon/silicon dioxide-coated substrate, a silicon nitride substrate, a glass substrate, an ITO substrate, a polyimide substrate, or a substrate coated with a low dielectric constant material (low-k material)) by an appropriate application method with, for example, a spinner or a coater, followed by baking of the composition, to thereby form a resist underlayer film. The baking is performed under appropriately determined conditions; i.e., a baking temperature of 80° C. to 250° C. and a baking time of 0.3 minutes to 60 minutes. Preferably, the baking temperature is 150° C. to 250° C., and the baking time is 0.5 minutes to 2 minutes. The thickness of the thus-formed underlayer film is, for example, 10 nm to 1,000 nm, or nm to 500 nm, or 30 nm to 300 nm, or 50 nm to 300 nm, or 50 nm to 200 nm.

An inorganic resist underlayer film (hard mask) may be formed on the organic resist underlayer film of the present invention. For example, such an inorganic resist underlayer film may be formed through spin coating of a silicon-containing resist underlayer film (inorganic resist underlayer film)-forming composition described in International Publication WO 2009/104552 pamphlet. Alternatively, an Si-containing inorganic material film may be formed by, for example, CVD.

The resist underlayer film-forming composition of the present invention can be applied onto a semiconductor substrate having a stepped portion and a non-stepped portion (so-called multi-level substrate), followed by baking of the composition, to thereby form a resist underlayer film so that the level difference between the stepped portion and the non-stepped portion falls within a range of, for example, 3 nm to 50 nm.

Subsequently, for example, a photoresist layer is formed on the resist underlayer film. The photoresist layer can be formed by a well-known process; i.e., application of a photoresist composition solution onto the underlayer film, and baking of the composition. The thickness of the photoresist layer is, for example, 50 nm to 10,000 nm, or 100 nm to 2,000 nm, or 200 nm to 1,000 nm.

No particular limitation is imposed on the photoresist formed on the resist underlayer film, so long as the photoresist is sensitive to light used for exposure. The photoresist may be either of negative and positive photoresists. Examples of the photoresist include a positive photoresist formed of a novolac resin and a 1,2-naphthoquinone diazide sulfonic acid ester; a chemically amplified photoresist formed of a binder having a group that decomposes with an acid to thereby increase an alkali dissolution rate and a photoacid generator; a chemically amplified photoresist formed of a low-molecular-weight compound that decomposes with an acid to thereby increase the alkali dissolution rate of the photoresist, an alkali-soluble binder, and a photoacid generator; and a chemically amplified photoresist formed of a binder having a group that decomposes with an acid to thereby increase an alkali dissolution rate, a low-molecular-weight compound that decomposes with an acid to thereby increase the alkali dissolution rate of the photoresist, and a photoacid generator. Specific examples of the photoresist include trade name APEX-E, available from Shipley, trade name PAR710, available from Sumitomo Chemical Company, Limited, and trade name SEPR430, available from Shin-Etsu Chemical Co., Ltd. Other examples of the photoresist include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Subsequently, light exposure is performed through a predetermined mask. The light exposure is performed with, for example, near-ultraviolet rays, far-ultraviolet rays, or extreme-ultraviolet rays (e.g., EUV (wavelength: 13.5 nm)). Specifically, the light exposure may involve the use of, for example, a KrF excimer laser (wavelength: 248 nm), an ArF excimer laser (wavelength: 193 nm), and an $F_2$ excimer laser (wavelength: 157 nm). Of these, an ArF excimer laser (wavelength: 193 nm) and EUV (wavelength: 13.5 nm) are preferred. After the light exposure, post exposure bake may optionally be performed. The post exposure bake is performed under appropriately determined conditions; i.e., a heating temperature of 70° C. to 150° C. and a heating time of 0.3 minutes to 10 minutes.

In the present invention, a resist for electron beam lithography may be used instead of the photoresist as the resist. The electron beam resist may be either of negative and positive resists. Examples of the electron beam resist include a chemically amplified resist formed of an acid generator and a binder having a group that decomposes with an acid to thereby change an alkali dissolution rate; a chemically amplified resist formed of an alkali-soluble binder, an acid generator, and a low-molecular-weight compound that decomposes with an acid to thereby change the alkali dissolution rate of the resist; a chemically amplified resist formed of an acid generator, a binder having a group that decomposes with an acid to thereby change an alkali dissolution rate, and a low-molecular-weight compound that decomposes with an acid to thereby change the alkali dissolution rate of the resist; a non-chemically amplified resist formed of a binder having a group that decomposes with electron beams to thereby change an alkali dissolution rate; and a non-chemically amplified resist formed of a binder having a moiety that is cut with electron beams to thereby change an alkali dissolution rate. Also in the case of use of such an electron beam resist, a resist pattern can be formed by using electron beams as an irradiation source in the same manner as in the case of using the photoresist.

Subsequently, development is performed with a developer. When, for example, a positive photoresist is used, an exposed portion of the photoresist is removed to thereby form a pattern of the photoresist.

Examples of the developer include alkaline aqueous solutions, for example, aqueous solutions of alkali metal hydroxides, such as potassium hydroxide and sodium hydroxide; aqueous solutions of quaternary ammonium hydroxides, such as tetramethylammonium hydroxide, tetraethylammonium hydroxide, and choline; and aqueous solutions of amines, such as ethanolamine, propylamine, and ethylenediamine. Such a developer may also contain, for example, a surfactant. The development is performed under appropriately determined conditions; i.e., a temperature of 5° C. to 50° C. and a time of 10 seconds to 600 seconds.

The resultant patterned photoresist (upper layer) is used as a protective film for removing the inorganic underlayer film (intermediate layer). Subsequently, the patterned photoresist and the patterned inorganic underlayer film (intermediate layer) are used as protective films for removing the organic underlayer film (lower layer). Finally, the patterned inorganic underlayer film (intermediate layer) and the patterned organic underlayer film (lower layer) are used as protective films for processing the semiconductor substrate.

Specifically, a photoresist-removed portion of the inorganic underlayer film (intermediate layer) is removed by dry etching. The dry etching of the inorganic underlayer film can be performed with any of gasses, such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane. The dry etching of the inorganic underlayer film is preferably performed with a halogen-containing gas, more preferably with a fluorine-containing gas. Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

Thereafter, the patterned photoresist and the patterned inorganic underlayer film are used as protective films for removing the organic underlayer film. The dry etching of the organic underlayer film (lower layer) is preferably performed with an oxygen-containing gas, since the inorganic underlayer film, which contains numerous silicon atoms, is less likely to be removed by dry etching with an oxygen-containing gas.

Finally, the semiconductor substrate is processed. The processing of the semiconductor substrate is preferably performed by dry etching with a fluorine-containing gas.

Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

An organic anti-reflective coating may be formed on the resist underlayer film before formation of the photoresist. No particular limitation is imposed on the composition used for formation of the anti-reflective coating, and the composition may be appropriately selected from anti-reflective coating compositions that have been conventionally used in a lithography process. The anti-reflective coating can be formed by a commonly used method, for example, application of the composition with a spinner or a coater, and baking of the composition.

In the present invention, an organic underlayer film can be formed on the substrate, an inorganic underlayer film can then be formed on the organic underlayer film, and then the inorganic underlayer film can be coated with a photoresist. This process can narrow the pattern width of the photoresist. Thus, even when the photoresist is applied thinly for preventing pattern collapse, the substrate can be processed through selection of an appropriate etching gas.

For example, the resist underlayer film can be processed by using, as an etching gas, a fluorine-containing gas that achieves a significantly high etching rate for the photoresist. The substrate can be processed by using, as an etching gas, a fluorine-containing gas that achieves a significantly high etching rate for the inorganic underlayer film. The substrate can be processed by using, as an etching gas, an oxygen-containing gas that achieves a significantly high etching rate for the organic underlayer film.

The resist underlayer film formed from the resist underlayer film-forming composition may absorb light used in a lithography process depending on the wavelength of the light. In such a case, the resist underlayer film can function as an anti-reflective coating having the effect of preventing reflection of light from the substrate. Furthermore, the underlayer film formed from the resist underlayer film-forming composition of the present invention can also function as a hard mask. The underlayer film of the present invention can be used as, for example, a layer for preventing the interaction between the substrate and the photoresist; a layer having the function of preventing the adverse effect, on the substrate, of a material used for the photoresist or a substance generated during the exposure of the photoresist to light; a layer having the function of preventing diffusion of a substance generated from the substrate during heating and baking to the photoresist serving as an upper layer; and a barrier layer for reducing a poisoning effect of a dielectric layer of the semiconductor substrate on the photoresist layer.

The underlayer film formed from the resist underlayer film-forming composition can be applied to a substrate having via holes for use in a dual damascene process, and can be used as an embedding material to fill up the holes. The underlayer film can also be used as a planarization material for planarizing the surface of a semiconductor substrate having irregularities.

EXAMPLES

The present invention will next be described in more detail with reference to, for example, examples. However, the present invention is not limited to the examples described below.

The weight average molecular weight and polydispersity shown below in Synthesis Example 1 are based on the results of measurement by gel permeation chromatography (hereinafter abbreviated as "GPC"). The GPC measurement was performed with a GPC apparatus available from TOSOH CORPORATION under the following conditions.

GPC column: TSKgel SuperMultipore [registered trademark] Hz-N (available from TOSOH CORPORATION)
Column temperature: 40° C.
Solvent: tetrahydrofuran (THF)
Flow rate: 0.35 mL/min
Standard sample: polystyrene (available from TOSOH CORPORATION)

Synthesis Example 1

In a nitrogen atmosphere, a 500-mL four-necked flask was charged with 37.33 g (0.1921 mol) of α,α'-dihydroxy-1,3-diisopropylbenzene (available from Tokyo Chemical Industry Co., Ltd.), 50.00 g (0.1921 mol) of N,N'-diphenyl-1,4-phenylenediamine (available from Tokyo Chemical Industry Co., Ltd.), and 1.53 g (0.008 mol) of p-toluenesulfonic acid monohydrate (available from Tokyo Chemical Industry Co., Ltd.), and 207.33 g of propylene glycol monomethyl ether acetate (hereinafter abbreviated as "PGMEA") (available from Kanto Chemical Co., Inc.) was further added to the flask. The resultant mixture was stirred and heated until observation of reflux for dissolution of the materials, to thereby initiate polymerization. After the elapse of 16 hours, the mixture was left to cool to 60° C. and then reprecipitated in 1,600 g of methanol (available from Kanto Chemical Co., Inc.). The resultant precipitate was filtered and dried with a reduced pressure dryer at 50° C. for 16 hours, to thereby yield 56.04 g of a polymer including a structural unit of Formula (S-1). The polymer was found to have a weight average molecular weight of 2,700 as determined by GPC in terms of polystyrene.

Formula (S-1)

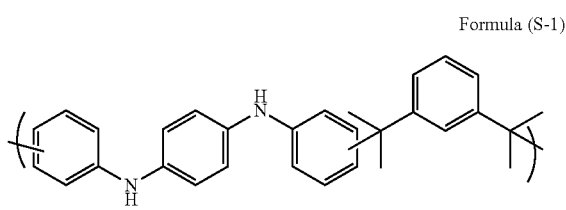

Synthesis Example 2

In a nitrogen atmosphere, a 300-mL three-necked flask was charged with 80.00 g (0.3648 mol) of N-phenyl-2-naphthylamine (available from Tokyo Chemical Industry Co., Ltd.), 46.78 g (0.3649 mol) of 2-ethylhexylaldehyde (available from Tokyo Chemical Industry Co., Ltd.), and 21.04 g (0.2189 mol) of methanesulfonic acid (available from Tokyo Chemical Industry Co., Ltd.), and 36.95 g of propylene glycol monomethyl ether was further added to the flask. The resultant mixture was heated and refluxed with stirring. After the elapse of 22 hours, the mixture was left to cool to room temperature and then reprecipitated in 1 L of methanol (available from Kanto Chemical Co., Inc.). The resultant precipitate was filtered and dried with a reduced pressure dryer at 60° C. for 67 hours, to thereby yield 64.97 g of a polymer of Formula (S-2). The polymer was found to have a weight average molecular weight Mw of 1,200 as determined by GPC in terms of polystyrene and a polydispersity Mw/Mn of 1.57.

Formula (S-2)

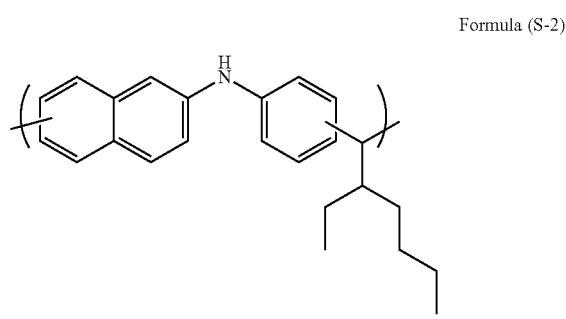

Example 1

To 1.227 g of the polymer prepared in Synthesis Example 1 were added 0.368 g of PGME-BIP-A (serving as a crosslinking agent) described in Synthesis Example 10 of International Publication WO 2014/208542 pamphlet, 0.055 g of pyridinium-p-phenolsulfonate serving as an acid catalyst, and 0.0025 g of MEGAFAC R-40 (available from DIC Corporation) serving as a surfactant, and the resultant mixture was dissolved in 6.92 g of propylene glycol monomethyl ether, 4.40 g of ethyl lactate, and 13.18 g of propylene glycol monomethyl ether acetate, to thereby prepare a solution. Thereafter, the solution was filtered with a polyethylene-made microfilter (pore size: 0.10 μm), and then filtered with a polyethylene-made microfilter (pore size: 0.05 μm), to thereby prepare a resist underlayer film-forming composition used for a lithography process.

Example 2

To 1.227 g of the polymer prepared in Synthesis Example 1 were added 0.368 g of PGME-BIP-A (serving as a crosslinking agent) described in Synthesis Example 10 of International Publication WO 2014/208542 pamphlet, 0.055 g of pyridinium-p-phenolsulfonate serving as an acid catalyst, and 0.0061 g of MEGAFAC R-40 (available from DIC Corporation) serving as a surfactant, and the resultant mixture was dissolved in 6.93 g of propylene glycol monomethyl ether, 4.40 g of ethyl lactate, and 13.22 g of propylene glycol monomethyl ether acetate, to thereby prepare a solution. Thereafter, the solution was filtered with a polyethylene-made microfilter (pore size: 0.10 μm), and then filtered with a polyethylene-made microfilter (pore size: 0.05 μm), to thereby prepare a resist underlayer film-forming composition used for a lithography process.

Example 3

To 0.906 g of the polymer prepared in Synthesis Example 2 were added 0.272 g of 3,3',5,5'-tetrakis(methoxymethyl)-4,4'-dihydroxybiphenyl (product name: TMOM-BP, available from Honshu Chemical Industry Co., Ltd.) serving as a crosslinking agent, 0.014 g of K-PURE TAG-2689 (available from King Industries Inc.) serving as an acid catalyst, and 0.009 g of MEGAFAC R-40 (available from DIC Corporation) serving as a surfactant, and the resultant mixture was dissolved in 5.640 g of propylene glycol monomethyl ether and 13.160 g of propylene glycol monomethyl ether acetate, to thereby prepare a solution. Thereafter, the solution was filtered with a polyethylene-made microfilter (pore size: 0.10 μm), to thereby prepare a resist underlayer film-forming composition used for a lithography process.

Comparative Example 1

Firstly, 1.228 g of the polymer prepared in Synthesis Example 1 was dissolved in 1.44 g of propylene glycol monomethyl ether and 13.16 g of propylene glycol monomethyl ether acetate, to thereby prepare a solution. Thereafter, the solution was filtered with a polyethylene-made microfilter (pore size: 0.10 μm), and then filtered with a polyethylene-made microfilter (pore size: 0.05 μm), to thereby prepare a resist underlayer film-forming composition used for a lithography process.

Comparative Example 2

To 0.913 g of the polymer prepared in Synthesis Example 2 were added 0.274 g of 3,3',5,5'-tetrakis(methoxymethyl)-4,4'-dihydroxybiphenyl (product name: TMOM-BP, available from Honshu Chemical Industry Co., Ltd.) serving as a crosslinking agent and 0.014 g of K-PURE TAG-2689 (available from King Industries Inc.) serving as an acid catalyst, and the resultant mixture was dissolved in 5.640 g of propylene glycol monomethyl ether and 13.160 g of propylene glycol monomethyl ether acetate, to thereby prepare a solution. Thereafter, the solution was filtered with a polyethylene-made microfilter (pore size: 0.10 μm), to thereby prepare a resist underlayer film-forming composition used for a lithography process.

(Test for Elution in Photoresist Solvent)

Each of the resist underlayer film-forming compositions prepared in Examples 1 and 2 and Comparative Example 1 was applied onto a silicon wafer with a spin coater. The composition was baked on a hot plate at 240° C. for one minute and then baked at 400° C. for one minute, to thereby form a resist underlayer film (thickness: 0.15 μm). The resist underlayer film was immersed in solvents used for a resist; i.e., ethyl lactate, propylene glycol monomethyl ether, propylene glycol monomethyl ether acetate, and cyclohexanone, and the film was found to be insoluble in these solvents.

Each of the resist underlayer film-forming compositions prepared in Example 3 and Comparative Example 2 was applied onto a silicon wafer with a spin coater. The composition was baked on a hot plate at 250° C. for one minute, to thereby form a resist underlayer film (thickness: 0.10 μm). The resist underlayer film was immersed in solvents used for a resist; i.e., propylene glycol monomethyl ether and propylene glycol monomethyl ether acetate, and the film was found to be insoluble in these solvents.

(Test for Coating on Multi-Level Substrate)

An SiO$_2$ substrate having a trench pattern (width: 50 nm, pitch width: 100 nm, depth: 200 nm) was used for evaluation of multi-level coating property. The thickness of a coating film at a dense patterned area (DENSE) (trench width: 50 nm, pitch: 100 nm) was compared with that at a non-patterned open area (OPEN). Each of the resist underlayer film-forming compositions of Examples 1 to 3 and Comparative Examples 1 and 2 was applied onto the aforementioned substrate so as to achieve a thickness of 150 nm, followed by baking at 240° C. for one minute and at 400° C. for one minute. Each of the resist underlayer film-forming compositions of Example 3 and Comparative Example 2 was applied onto the aforementioned substrate so as to achieve a thickness of 150 nm, followed by baking at 250° C. for one minute. For evaluation of the multi-level coating property of the composition with respect to the substrate, the substrate was observed with a scanning electron microscope (S-4800) available from Hitachi High-Technologies Corporation, and the thickness of the film from the upper surface of the substrate was measured at the dense area (patterned area) and the open area (non-patterned area) of the multi-level substrate. The planarity was evaluated by measuring the difference between the film thicknesses at the dense area and the open area (i.e., the difference in coating level between these areas; hereinafter referred to as "Bias"). Table 1 shows the film thickness at each area and the difference in coating level (Bias). The planarity is evaluated as high when the Bias is small.

TABLE 1

Planarity test on trench wafer

| Resist underlayer film | Film thickness (patterned area) | Film thickness (non-patterned area) | Bias |
|---|---|---|---|
| Example 1 | 127 nm | 141 nm | 14 nm |
| Example 2 | 109 nm | 135 nm | 26 nm |
| Example 3 | 111 nm | 121 nm | 10 nm |
| Comparative Example 1 | 145 nm | 115 nm | −30 nm |
| Comparative Example 2 | 123 nm | 99 nm | −24 nm |

The results of the coating test on the multi-level substrate indicate that the difference in coating level between the patterned area and the open area is smaller in Examples 1 to 3 than in Comparative Examples 1 and 2. Thus, the resist underlayer films formed from the resist underlayer film-forming compositions of Examples 1 to 3 are regarded as having good planarity.

The invention claimed is:

1. A method for reducing the level difference (iso-dense bias) of a resist underlayer film between a stepped portion and a non-stepped portion of a semiconductor substrate by 5 nm or more, the method comprising:

forming a film from a composition comprised of a polymer and a solvent, and free of fluorine-containing surfactant, on an upper surface of a semiconductor substrate over both a stepped portion and a non-stepped portion of the semiconductor substrate, to form the resist underlayer film, wherein the film has a first film thickness over the stepped portion measured from the upper surface of the semiconductor substrate at the stepped portion and a second film thickness over the non-stepped portion measured from the upper surface of the semiconductor substrate at the non-stepped portion, determining that the film has a maximum thickness of the first film thickness of the film over the stepped portion as measured from the upper surface of the semiconductor substrate at the stepped portion larger than a minimum thickness of the second film thickness of the film over the non-stepped portion as measured from the upper surface of the semiconductor substrate at the non-stepped portion, following the determining, adding a fluorine-containing surfactant to the composition comprised of the polymer and the solvent to form a resist underlayer film-forming composition; and applying the resist underlayer film-forming composition to an upper surface of a same semiconductor substrate as the film over both a stepped portion and a non-stepped portion of the semiconductor substrate in an identical manner as the film, to form the resist underlayer film, the resist underlayer film having a first thickness over the stepped portion measured from the upper surface of the semiconductor substrate at the stepped portion and a second thickness over the non-stepped portion measured from the upper surface of the semiconductor substrate at the non-stepped portion, wherein a difference of 5 nm or more is established between (1) a thickness difference, determined by subtraction of the first thickness of the resist underlayer film at the stepped portion from the second thickness of the resist underlayer film at the non-stepped portion, in the resist underlayer film formed from the resist underlayer film-forming composition containing the fluorine-containing surfactant and (2) a thickness difference, determined by subtraction of the first film thickness of the film at the stepped portion from the second film thickness of the film at the non-stepped portion, in the film formed from the composition, such that the level difference is reduced by 5 nm or more by application of the resist underlayer film-forming composition.

2. The method according to claim 1, wherein the resist underlayer film-forming composition further contains a crosslinkable compound.

3. The method according to claim 2, wherein the crosslinkable compound is a crosslinkable compound of the following Formula (11-1) or (12-1):

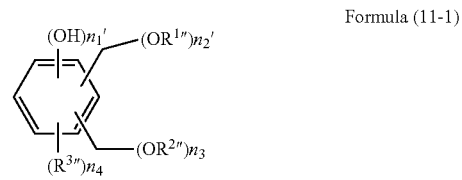

Formula (11-1)

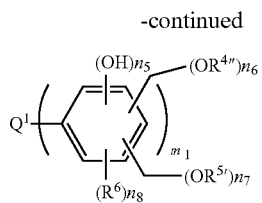

Formula (12-1)

wherein $Q^1$ is a single bond or an $m_1$-valent organic group; $R^{1''}$ and $R^{4''}$ are each a $C_{2-10}$ alkyl group, or a $C_{2-10}$ alkyl group having a $C_{1-10}$ alkoxy group; $R^{2''}$ and $R^{5'}$ are each a hydrogen atom or a methyl group; $R^{3''}$ and $R^6$ are each a $C_{1-10}$ alkyl group or a $C_{6-40}$ aryl group; $n_1{'}$ is an integer satisfying a relation of $1 \leq n_1{'} \leq 3$, $n_2{'}$ is an integer satisfying a relation of $2 \leq n_2{'} \leq 5$, $n_3$ is an integer satisfying a relation of $0 \leq n_3 \leq 3$, $n_4$ is an integer satisfying a relation of $0 \leq n_4 \leq 3$, and a relation of $3 \leq (n_1{'} + n_2{'} + n_3 + n_4) \leq 6$ is satisfied; and $n_5$ is an integer satisfying a relation of $1 \leq n_5 \leq 3$, $n_6$ is an integer satisfying a relation of $1 \leq n_6 \leq 4$, $n_7$ is an integer satisfying a relation of $0 \leq n_7 \leq 3$, $n_8$ is an integer satisfying a relation of $0 \leq n_8 \leq 3$, and a relation of $2 \leq (n_5 + n_6 + n_7 + n_8) \leq 5$ is satisfied; and $m_1$ is an integer of 2 to 10.

4. The method according to claim 1, wherein the polymer includes a partial structure of the following Formula (2):

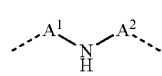

Formula (2)

wherein $A^1$ is a phenylene group or a naphthylene group; $A^2$ is a phenylene group, a naphthylene group, or an organic group of the following Formula (3):

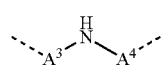

Formula (3)

wherein $A^3$ and $A^4$ are each independently a phenylene group or a naphthylene group, and a dotted line is a bond; and a dotted line is a bond.

5. The method according to claim 1, wherein the polymer includes a unit structure of the following Formula (1):

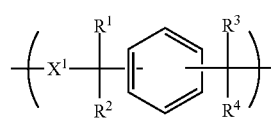

Formula (1)

wherein $R^1$ to $R^4$ are each independently a hydrogen atom or a methyl group; and $X^1$ is a divalent organic group containing at least one arylene group optionally substituted with an alkyl group, an amino group, or a hydroxyl group.

6. The method according to claim 5, wherein $X^1$ in Formula (1) is an organic group of Formula (2).

7. The method according to claim 1, wherein the polymer contains a novolac resin prepared by reaction between an aromatic compound and an aldehyde having a formyl group bonded to a secondary carbon atom or tertiary carbon atom of a $C_{2-26}$ alkyl group.

8. The method according to claim 1, wherein the polymer contains a novolac polymer prepared by reaction between an aromatic compound having a secondary amino group and an aldehyde compound.

9. The method according to claim 1, wherein the polymer is a polymer including a unit structure of the following Formula (4):

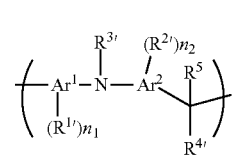

Formula (4)

wherein $Ar^1$ and $Ar^2$ are each a benzene ring or a naphthalene ring; $R^{1'}$ and $R^{2'}$ are each a substituent for a hydrogen atom on the corresponding ring and is selected from the group consisting of a halogen atom, a nitro group, an amino group, a hydroxy group, a $C_{1-10}$ alkyl group, a $C_{2-10}$ alkenyl group, a $C_{6-40}$ aryl group, and any combination of these, wherein the alkyl group, the alkenyl group, and the aryl group are each an organic group optionally containing an ether bond, a ketone bond, or an ester bond; $R^{3'}$ is selected from the group consisting of a hydrogen atom, a $C_{1-10}$ alkyl group, a $C_{2-10}$ alkenyl group, a $C_{6-40}$ aryl group, and any combination of these, wherein the alkyl group, the alkenyl group, and the aryl group are each an organic group optionally containing an ether bond, a ketone bond, or an ester bond; $R^{4'}$ is selected from the group consisting of a $C_{6-40}$ aryl group and a heterocyclic group, wherein the aryl group and the heterocyclic group are each an organic group optionally substituted with a halogen atom, a nitro group, an amino group, a $C_{1-10}$ alkyl group, a $C_{1-10}$ alkoxy group, a $C_{6-40}$ aryl group, a formyl group, a carboxyl group, or a hydroxyl group; $R^5$ is selected from the group consisting of a hydrogen atom, a $C_{1-10}$ alkyl group, a $C_{6-40}$ aryl group, and a heterocyclic group, wherein the alkyl group, the aryl group, and the heterocyclic group are each an organic group optionally substituted with a halogen atom, a nitro group, an amino group, or a hydroxyl group; $R^{4'}$ and $R^5$ optionally form a ring together with the carbon atom to which they are bonded; and $n_1$ and $n_2$ are each an integer of 0 to 3.

10. The method according to claim 1, wherein the level difference between the stepped portion and the non-stepped portion of the semiconductor substrate is reduced by 5 nm to 55 nm.

11. The method according to claim 1, wherein the upper surface of the stepped portion of the semiconductor substrate has a step pattern having a width of from more than 0 nm to 50 nm.

* * * * *